(12) United States Patent
Song et al.

(10) Patent No.: US 9,425,143 B2
(45) Date of Patent: Aug. 23, 2016

(54) INTEGRATED DEVICE PACKAGE COMPRISING AN ELECTROMAGNETIC (EM) PASSIVE DEVICE IN AN ENCAPSULATION LAYER, AND AN EM SHIELD

(71) Applicant: QUALCOMM Incorporated, San Diego, CA (US)

(72) Inventors: Young Kyu Song, San Diego, CA (US); Kyu-Pyung Hwang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/543,575

(22) Filed: Nov. 17, 2014

(65) Prior Publication Data

US 2016/0141244 A1    May 19, 2016

(51) Int. Cl.
| | |
|---|---|
| H01L 23/522 | (2006.01) |
| H01L 23/28 | (2006.01) |
| H01L 23/50 | (2006.01) |
| H01L 23/552 | (2006.01) |
| H01L 21/56 | (2006.01) |
| H01F 27/29 | (2006.01) |
| H01L 23/64 | (2006.01) |
| H01L 23/00 | (2006.01) |
| H01L 25/16 | (2006.01) |
| H01F 17/00 | (2006.01) |

(52) U.S. Cl.
CPC .......... *H01L 23/5227* (2013.01); *H01F 27/292* (2013.01); *H01L 21/56* (2013.01); *H01L 23/28* (2013.01); *H01L 23/50* (2013.01); *H01L 23/552* (2013.01); *H01L 23/645* (2013.01); *H01L 24/18* (2013.01); *H01L 25/16* (2013.01); *H01F 2017/002* (2013.01)

(58) Field of Classification Search
CPC ..... H01L 23/5227; H01L 23/28; H01L 23/50; H01L 23/552; H01L 21/56; H01L 27/292; H01L 23/645; H01L 24/18; H01L 25/16
See application file for complete search history.

(56) References Cited

U.S. PATENT DOCUMENTS

| | | | |
|---|---|---|---|
| 7,064,645 B2 | 6/2006 | Kobayashi et al. | |
| 8,482,107 B2 | 7/2013 | Rokuhara et al. | |
| 8,692,354 B2 | 4/2014 | Nakashiba | |
| 2008/0116541 A1 | 5/2008 | Erturk et al. | |
| 2011/0062549 A1* | 3/2011 | Lin | H01L 23/3128 257/531 |
| 2013/0292808 A1* | 11/2013 | Yen | H01L 23/552 257/660 |
| 2013/0328207 A1 | 12/2013 | Sankman et al. | |

* cited by examiner

*Primary Examiner* — Long Pham
(74) *Attorney, Agent, or Firm* — Loza & Loza, LLP

(57) ABSTRACT

Some novel features pertain to an integrated device package that includes a die, an electromagnetic (EM) passive device, an encapsulation layer covering the die and the EM passive device, and a redistribution portion coupling the die and the EM passive device. In some implementations, the EM passive device includes an electromagnetic (EM) passive device. The EM passive device includes a base layer, a via traversing the base layer, a pad coupled to the via, and at least redistribution layer configured to operate as electromagnetic (EM) passive component, where the redistribution layer is coupled to the pad. The redistribution portion of the EM passive device includes at least one redistribution layer that is configured to electrically couple the die to the EM passive device. The redistribution portion includes at least one redistribution layer that is configured as an electromagnetic (EM) shield.

24 Claims, 22 Drawing Sheets

INTEGRATED DEVICE PACKAGE COMPRISING AN ELECTROMAGNETIC (EM) PASSIVE DEVICE IN AN ENCAPSULATION LAYER, AND AN EM SHIELD

BACKGROUND

1. Field

Various features relate to an integrated device package that includes an electromagnetic (EM) passive device in an encapsulation layer, and an EM shield.

2. Background

Inductors that are located in integrated circuit (IC) packages are limited in their capabilities for supporting high current due to the limited real estate in IC packages. Specifically, since these inductors are located in the packaging substrate of IC packages, the size of these inductors is limited by the size of the packaging substrate of IC packages. As a result of the restricted space in the packaging substrate of IC packages, these inductors typically have a high resistance and a low quality (Q) factor. FIG. 1 conceptually illustrates a semiconductor device that includes an inductor. Specifically, FIG. 1 illustrates a die 100, a package substrate 102, a set of solder balls 104, a printed circuit board (PCB) 106, and an inductor 108. As shown in FIG. 1, the die 100 is coupled to the package substrate 102. The package substrate 102 is coupled to the PCB 106 through the set of solder balls 104. The inductor 108 is defined and located in the package substrate 102.

FIG. 1 also illustrates that some solder balls have been omitted/removed in a region near the inductor 108. This is because solder balls can affect/disrupt the performance of an inductor. More specifically, solder balls that are near an inductor can disrupt the magnetic flux of an inductor, resulting in a low inductance and low Q factor for the inductor, which is why solder balls are removed in a region near an inductor. However, removing solder balls between a package substrate and a PCB can affect the structural stability of the packaging substrate and the PCB. Thus, current IC design must weigh the benefit of removing solder balls (e.g., better inductance and Q factor inductor) versus the disadvantage of removing solder balls (e.g., less stable packaging substrate/PCB structure), when determining how many solder balls to use and where to put solder balls when coupling a die and packaging substrate to a PCB.

One major drawback of the integrated package shown in FIG. 1 is that it creates an integrated package with a form factor that may be too large for the needs of mobile computing devices. For example, the location of the inductor 108 may limit how small the integrated package can be. This may result in a package that is either too large and/or too thick. That is, the integrated package configuration shown in FIG. 1 may be too thick and/or have a surface area that is too large to meet the needs and/or requirements of mobile computing devices. However, the problem with putting the inductor 108 closer to the die 100 can result in the inductor 108 interfering with the circuit of the die 100.

Therefore, there is a need for an integrated package that includes an improved configuration for an electromagnetic passive device. Ideally, such an integrated device will have a better form factor, while at the same time meeting the needs and/or requirements of mobile computing devices. Moreover, such an improved configuration of the electromagnetic passive device would provide better integrated device performance (e.g., better signal, better channel, better electrical speed performance) without interfering with the circuit of an integrated device.

SUMMARY

Various features, apparatus and methods described herein provide an integrated device package that includes an electromagnetic (EM) passive device in an encapsulation layer, and an EM shield.

A first example provides an integrated device package that includes a die, an electromagnetic (EM) passive device, an encapsulation layer covering the die and the EM passive device, and a redistribution portion coupling the die and the EM passive device.

According to an aspect, the EM passive device includes an electromagnetic (EM) passive component.

According to one aspect, the EM passive component includes at least one of an inductor, a coupler and/or a transformer.

According to an aspect, the EM passive device includes a base layer, a via traversing the base layer, a pad coupled to the via, and at least one redistribution layer configured to operate as an electromagnetic (EM) passive component, wherein the redistribution layer is coupled to the pad.

According to one aspect, the redistribution portion includes at least one redistribution layer that is configured to electrically couple the die to the EM passive device.

According to an aspect, the redistribution portion includes at least one redistribution layer that is configured as an electromagnetic (EM) shield.

According to one aspect, the EM shield is located in the redistribution portion such that the EM shield is at least partially vertically aligned with the EM passive device.

According to an aspect, the EM shield is configured to provide an electrical path for a ground signal.

According to one aspect, the EM shield is configured to be electrically coupled to the EM passive device.

According to an aspect, the integrated device package is incorporated into at least one of a music player, a video player, an entertainment unit, a navigation device, a communications device, a mobile device, a mobile phone, a smartphone, a personal digital assistant, a fixed location terminal, a tablet computer, a computer, a wearable device, and/or a laptop computer.

A second example provides an apparatus that includes a die, an electromagnetic (EM) means, an encapsulation layer covering the die and the EM means, and a redistribution portion coupling the die and the EM means.

According to an aspect, the EM means includes an electromagnetic (EM) passive component.

According to one aspect, the EM passive component comprises at least one of an inductor, a coupler and/or a transformer.

According to an aspect, the EM means includes a base layer, a via traversing the base layer, a pad coupled to the via, and at least one redistribution layer configured to operate as an electromagnetic (EM) passive component, wherein the redistribution layer is coupled to the pad.

According to one aspect, the redistribution portion includes at least one redistribution layer that is configured to electrically couple the die to the EM means.

According to an aspect, the redistribution portion includes at least one redistribution layer that is configured as an electromagnetic (EM) shielding means.

According to one aspect, the EM shielding means is located in the redistribution portion such that the EM shielding means is at least partially vertically aligned with the EM means.

According to an aspect, the EM shielding means is configured to provide an electrical path for a ground signal.

According to one aspect, the EM shielding means is configured to be electrically coupled to the EM means.

According to an aspect, the apparatus is incorporated into at least one of a music player, a video player, an entertainment unit, a navigation device, a communications device, a mobile device, a mobile phone, a smartphone, a personal digital assistant, a fixed location terminal, a tablet computer, a computer, a wearable device, and/or a laptop computer.

A third example provides a method for fabricating an integrated device package. The method provides a die. The method further provides an electromagnetic (EM) passive device. The method also forms an encapsulation layer on the die and the EM passive device. The method further forms a redistribution portion that couples the die and the EM passive device.

According to an aspect, the EM passive device includes an electromagnetic (EM) passive component.

According to one aspect, the EM passive component comprises at least one of an inductor, a coupler and/or a transformer.

According to an aspect, providing the EM passive device includes forming a base layer, forming a via that traverses the base layer, forming a pad that couples the via, and forming at least one redistribution layer configured to operate as an electromagnetic (EM) passive component, where the redistribution layer is coupled to the pad.

According to one aspect, forming the redistribution portion includes forming at least one redistribution layer that is configured to electrically couple the die to the EM passive device.

According to an aspect, forming the redistribution portion includes forming at least one redistribution layer that is configured as an electromagnetic (EM) shield.

According to one aspect, the EM shield is located in the redistribution portion such that the EM shield is at least partially vertically aligned with the EM passive device.

According to an aspect, the EM shield is configured to provide an electrical path for a ground signal.

According to one aspect, the EM shield is configured to be electrically coupled to the EM passive device.

According to an aspect, the integrated device package is incorporated into at least one of a music player, a video player, an entertainment unit, a navigation device, a communications device, a mobile device, a mobile phone, a smartphone, a personal digital assistant, a fixed location terminal, a tablet computer, a computer, a wearable device, and/or a laptop computer.

DRAWINGS

Various features, nature and advantages may become apparent from the detailed description set forth below when taken in conjunction with the drawings in which like reference characters identify correspondingly throughout.

DETAILED DESCRIPTION

Figure 1:
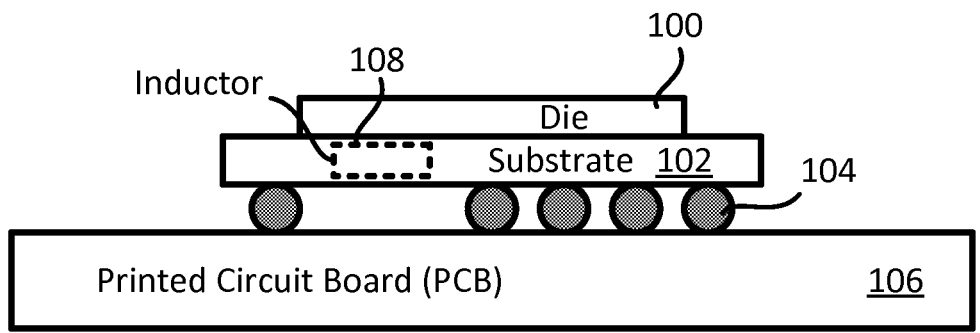
FIG. 1 illustrates a known inductor integrated in a package substrate.

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Overview

Some novel features pertain to an integrated device package that includes a die, an electromagnetic (EM) passive device, an encapsulation layer covering the die and the EM passive device, a redistribution portion coupling the die and the EM passive device. In some implementations, the EM passive device includes an electromagnetic (EM) passive component. The EM passive component includes at least one of an inductor, a coupler and/or a transformer. In some implementations, the EM passive device includes a base layer, a via traversing the base layer, a pad coupled to the via, and at least one redistribution layer, where the redistribution layer is coupled to the pad. In some implementations, the redistribution portion includes at least one redistribution layer that is configured to electrically couple the die to the EM passive device. In some implementations, the redistribution portion includes at least one redistribution layer that is configured as an electromagnetic (EM) shield.

An EM shield provides several technical advantages in an integrated device package. In some instances, a solder ball may adversely affect the performance of a nearby EM passive device. However, removing solder ball(s) near an EM passive device may not be possible or practical due to design constraints and/or requirements. In such instances, an EM shield provides a practical solution for providing a high inductance and/or high Q factor EM passive device. This is because, an EM shield may reduce, minimize, or shield the effect of solder ball(s) on the performance of a nearby EM passive device and/or EM passive component. For example, an EM shield may reduce, minimize, or shield the disruption of solder balls on the magnetic flux of the EM passive device. By doing so, the EM shield may help with providing an EM passive device with a high inductance and a high Q factor, without having to remove solder ball(s) near the EM passive device.

An interconnect is an element or component that allows or facilitates an electrical connection between two points, elements and/or components. In some implementations, an interconnect may include a trace, a via, a pad, a pillar, a redistribution metal layer, and/or an under-bump metallization (UBM) layer. In some implementations, an interconnect is an electrically conductive material that provides an electrical path for a signal (e.g., data signal, ground signal, power signal). An interconnect may include more than one element/component.

A redistribution layer (or a redistribution metal layer) is a metal layer of a redistribution portion of an integrated device and/or integrated device package. A redistribution layer may include one or more redistribution interconnects, which are formed on the same metal layer of the redistribution portion. A redistribution portion of an integrated device may include several redistribution layers, each redistribution layer may include one or more redistribution interconnects. Thus, for example, a redistribution portion may include a first redistribution interconnect on a first redistribution layer, and a second redistribution interconnect on a second redistribution layer that is different than the first redistribution layer.

An electromagnetic (EM) passive device is a passive device that produces a magnetic field when a current/electricity passes through the device, or produces a current/electricity in the presence of a magnetic field. An EM passive device may include an inductor (e.g., spiral inductor), a coupler, and/or a transformer. A coupler or transformer may include two or more inductors. An electromagnetic (EM) passive device may include an EM passive component. An EM passive component may include an inductor (e.g., spiral inductor), a coupler, and/or a transformer. In some implementations, a passive component is a component that consumes energy, but does not produce energy. Consequently, a passive device may be a device that consumes energy, but does not produce energy. In some implementations, an EM passive component may include a radio frequency (RF) passive component. Similarly, an EM passive device may include a radio frequency (RF) passive device.

Figure 2:
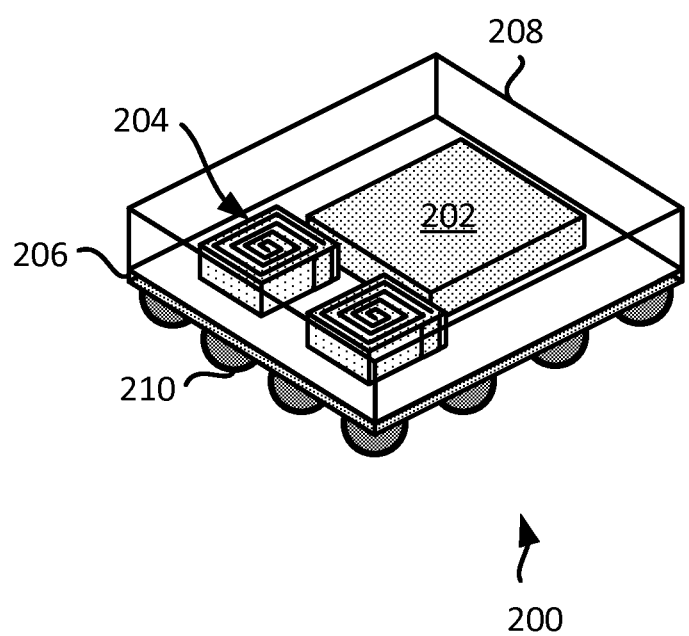
FIG. 2 illustrates an example of an integrated device package comprising an electromagnetic passive device.

Exemplary Integrated Device Package Comprising an Electromagnetic (EM) Passive Device in an Encapsulation Layer, and an EM Shield FIG. 2 illustrates an angled view of an example of an integrated device package 200 that includes a passive device in an encapsulation layer. Specifically, FIG. 2 illustrates an integrated device package 200 that includes a die 202, an electromagnetic (EM) passive device 204, a redistribution portion 206, an encapsulation layer 208, and a set of solder balls 210.

The die 202 may include a substrate, several lower level metal layers, and several dielectric layers. A more detailed example of a die is at least further described in FIG. 3 below. The EM passive device 204 includes an EM passive component. The EM passive device 204 may be an EM means. An EM passive device may include one or more EM passive components, such as an inductor, a coupler and/or a transformer. The EM passive device and/or component may be defined by one or more metal layers in the passive device 204. The EM passive device 204 may also include one or more vias (e.g., through mold vias, through dielectric vias, through substrate vias). A more detailed example of an EM passive device is at least further described in FIG. 3 below.

The die 202 and the EM passive device 204 may be electrically coupled together through the redistribution portion 206. The redistribution portion 206 may include one or more redistribution metal layers (e.g., RDL layers). One or more of these redistribution metal layers may define one or more redistribution interconnects. In some implementations, the redistribution interconnects may provide an electrical path between (e.g., electrically couple) the die 202 and the EM passive device 204.

The die 202 and the EM passive device 204 are coupled to a first side (e.g., top side) of the redistribution portion 206. The EM passive device 204 is located on the redistribution portion 206 such that the EM passive device 204 is positioned laterally to the die 202. The set of solder balls 210 is coupled to a second side (e.g., bottom side) of the redistribution portion 206. As shown in FIG. 2, there can be more than one EM passive device 204. Different implementations may position the EM passive device(s) 204 differently around (e.g., laterally around) the die 202.

The encapsulation layer 208 covers the die 202 and the EM passive device 204. Different implementations may use different materials for the encapsulation layer 208. In some implementations, the encapsulation layer 208 includes one of at least a mold, a polymer and/or an epoxy fill.

Although not visible, the integrated device package 200 may also include an electromagnetic (EM) shield. The EM shield may be located in the redistribution portion 206. In some implementations, the EM shield is at least partially vertically aligned with one or more EM passive device 204. In some implementations, the EM shield is configured to minimize and/or reduce the impact of the set of solder balls 210 on the EM passive device 204. In some implementations, the EM shield is electrically coupled to a ground signal, a solder ball, and/or the EM passive device 204. The EM shield may be an EM shielding means. In some implementations, the EM shield includes a radio frequency (RF) shield/RF shielding means.

Having described an example of an integrated device package that includes an EM passive device in an encapsulation layer, more detailed examples of an integrated device package that includes an EM passive device in an encapsulation layer will now be described below.

Figure 3:
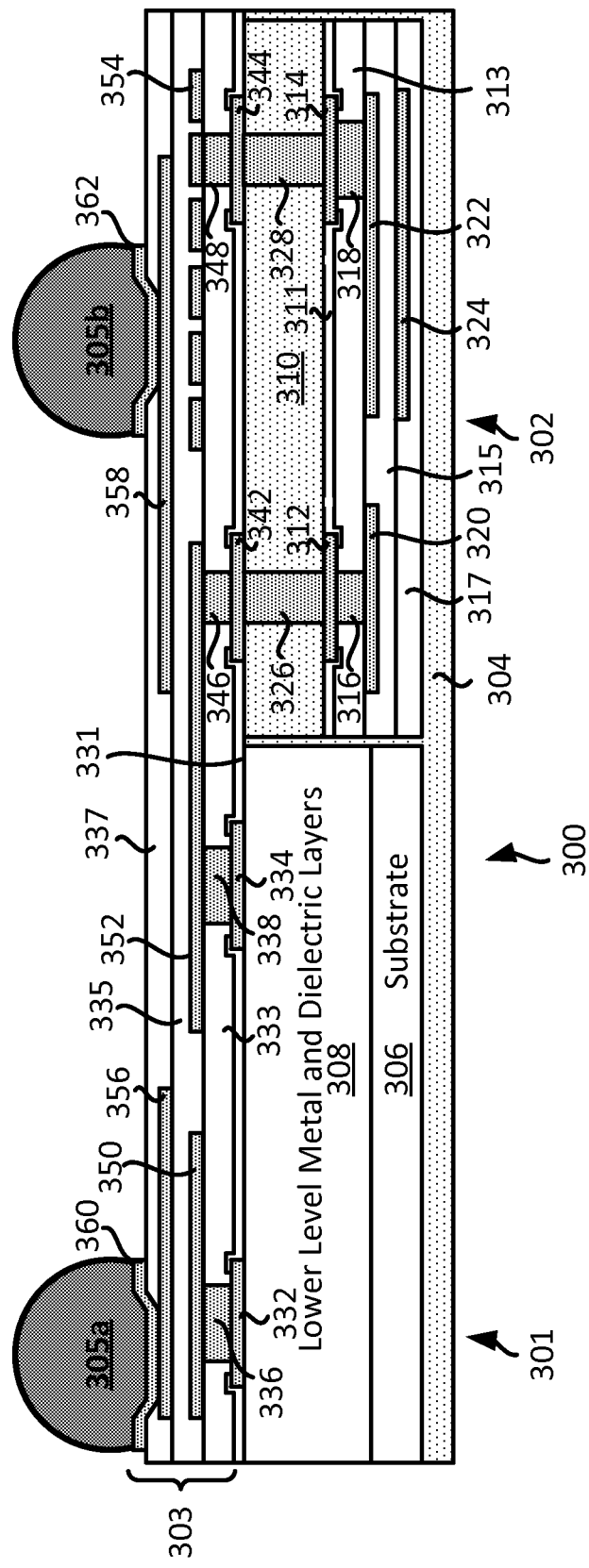
FIG. 3 illustrates an example of a profile view of an integrated device package comprising an electromagnetic passive device.

Exemplary Integrated Device Package Comprising an Electromagnetic (EM) Passive Device in an Encapsulation Layer, and an EM Shield FIG. 3 illustrates a profile view of an example of an integrated device package 300 that includes an electromagnetic (EM) passive device in an encapsulation layer. Specifically, FIG. 3 illustrates an integrated device package 300 that includes a die 301, an EM passive device 302, a redistribution portion 303, an encapsulation layer 304, and a set of solder balls 305 (e.g., solder balls 305a, 305b). In some implementations, the integrated device package 300 is a wafer level integrated device package.

The die 301 includes a substrate 306 and lower level metal and dielectric layers 308. In some implementations, the substrate 306 is a silicon substrate and/or wafer (e.g., silicon wafer). The lower level metal and dielectric layers 308 include lower level metal layers (e.g., M1 metal layer, M2 metal layer, M3 metal layer, M4 metal layer, M5 metal layer, M6 metal layer, M7 metal layer). The lower metal layers of the lower level metal and dielectric layers 308 include traces and/or vias. The lower level metal and dielectric layers 308 also include one or more dielectric layers. In some implementations, the lower level metal and dielectric layers 308 are provided and/or formed using a back end of line (BEOL) process.

The EM passive device 302 includes a base layer 310, a first passivation layer 311, a first dielectric layer 313, a second dielectric layer 315, a third dielectric layer 317, a first interconnect 312, a second interconnect 314, a third interconnect 316, a fourth interconnect 318, a fifth interconnect 320, a sixth interconnect 322, a seventh interconnect 324, an eighth interconnect 326, and a ninth interconnect 328. The base layer 310 may includes one of at least a substrate layer, a dielectric layer, and/or an encapsulation layer. The interconnects 312 and 314 may be configured as pads. The interconnects 316 and 318 may be configured as vias. The interconnects 320, 322 and 324 may be configured as traces. The interconnects 326 and 328 may be configured as vias (e.g., through substrate vias, through encapsulation layer vias, through dielectric vias).

The EM passive device 302 includes an EM passive component. An EM passive device and/or component may include one of at least an inductor, a coupler and/or a transformer. The EM passive component may be defined by one or more metal layers in the EM passive device 302. In some implementations, the EM passive component of the EM passive device 302 may be defined by at least a portion of the fifth interconnect 320, the sixth interconnect 322, and/or the seventh interconnect 324. For example, the interconnects 322 or 324 may be configured as an inductor. In another example, the combination of the interconnects 322 and 324 may be configured as a coupler or a transformer. An example of an inductor is further described in FIG. 7. The EM passive device 204 may be an EM means.

The encapsulation layer 304 encapsulates the die 301 and the EM passive device 302. Different implementations may use different materials for the encapsulation layer 304. In some implementations, the encapsulation layer 304 includes one of at least a mold, a polymer and/or an epoxy fill.

As shown in FIG. 3, a second passivation layer 331 is formed on the die 301 and the EM passive device 302. A first pad 332 and a second pad 334 are formed over the die 301. A third pad 342 and a fourth pad 344 are formed over the EM passive device 302.

The redistribution portion 303 is coupled to the die 301 and the EM passive device 302. In some implementations, the redistribution portion 303 is formed over the second passivation layer 331 and the pads 332, 334, 342, and 344. In some implementations, the second passivation layer 331 and the pads 332, 334, 342, and 344 are part of the redistribution portion 303. In some implementations, the redistribution portion 303 is configured to provide an electrical path between the die 301 and the EM passive device 302.

The redistribution portion 303 includes a first dielectric layer 333, a second dielectric layer 335, a third dielectric layer 337, a first via 336, a second via 338, a third via 346, a fourth via 348, a first interconnect 350, a second interconnect 352, a third interconnect 356, a fourth interconnect 358, a first under-bump metallization (UBM) layer 360, a second UBM layer 362, and/or an electromagnetic (EM) shield 354.

As shown in FIG. 3, the die 301 is electrically coupled to the EM passive device 302 through the second pad 334, the second via 338, the interconnect 352, the third via 346, and the third pad 342. In some implementations, the second pad 334, the second via 338, the interconnect 352, the third via 346, and the third pad 342 provide an electrical path between the die 301 and the EM passive device 302. However, it should be noted that different implementations may provide different electrical paths between the die 301 and the EM passive device 302.

FIG. 3 illustrates that the EM shield 354 is located in the redistribution portion 303. In some implementations, the EM shield 354 is at least partially vertically aligned with one or more EM passive device 302. In some implementations, the EM shield 354 is at least partially vertically aligned with one or more EM passive components in the EM passive device 302. In some implementations, the EM shield 354 is configured to minimize and/or reduce the impact of the set of solder balls 305 (e.g., solder ball 305b) on the EM passive device 302 (e.g., on the EM passive device of the EM passive device 302). In some implementations, the EM shield 354 is electrically coupled to a ground signal, a solder ball and/or the EM passive device 302 (e.g., to the EM passive component of the EM passive device 302). An example of an EM shield is further described in detail in FIG. 8. The EM shield 354 may be an EM shielding means.

Figure 4:
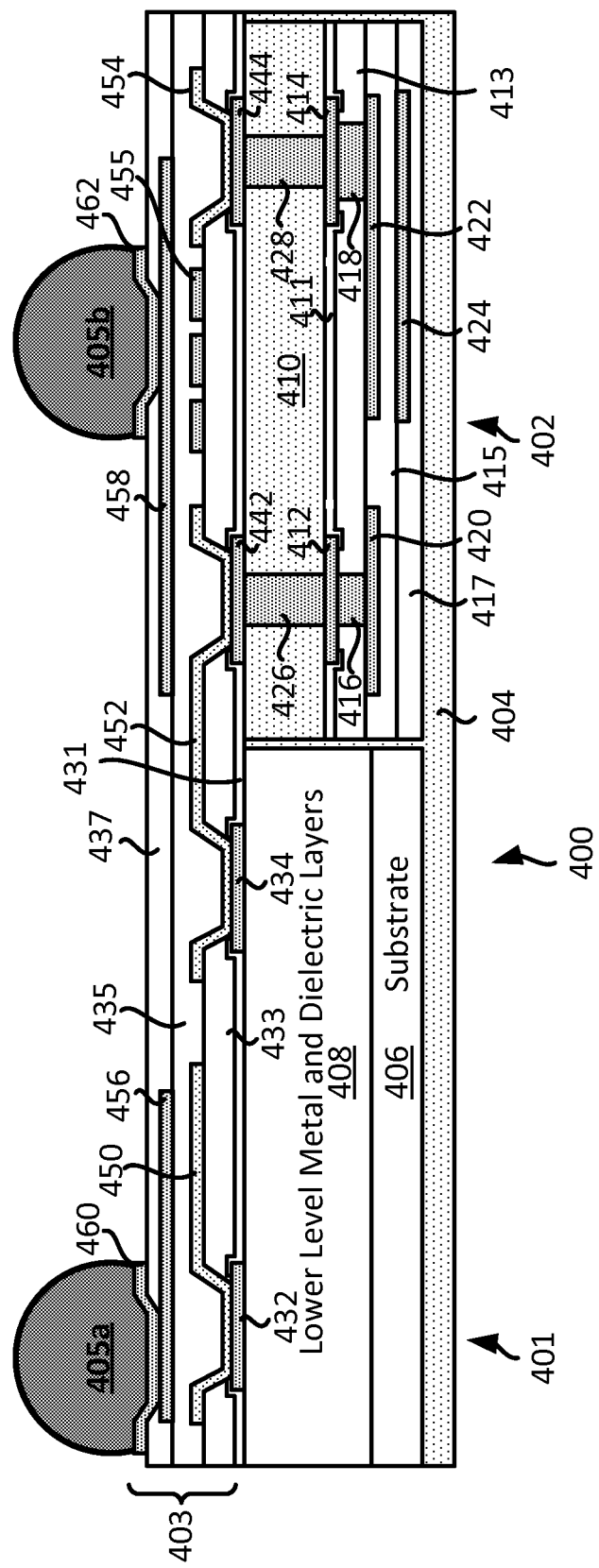
FIG. 4 illustrates an example of a profile view of an integrated device package comprising an electromagnetic passive device.

Exemplary Integrated Device Package Comprising an Electromagnetic (EM) Passive Device in an Encapsulation Layer, and an EM Shield FIG. 4 illustrates a profile view of an example of an integrated device package 400 that includes an electromagnetic (EM) passive device in an encapsulation layer. Specifically, FIG. 4 illustrates an integrated device package 400 that includes a die 401, an EM passive device 402, a redistribution portion 403, an encapsulation layer 404, and a set of solder balls 405 (e.g., solder balls 405a, 405b). In some implementations, the integrated device package 400 is a wafer level integrated device package.

The die 401 includes a substrate 406 and lower level metal and dielectric layers 408. In some implementations, the substrate 406 is a silicon substrate and/or wafer (e.g., silicon wafer). The lower level metal and dielectric layers 408 include lower level metal layers (e.g., M1 metal layer, M2 metal layer, M3 metal layer, M4 metal layer, M5 metal layer, M6 metal layer, M7 metal layer). The lower metal layers of the lower level metal and dielectric layers 408 include traces and/or vias. The lower level metal and dielectric layers 408 also include one or more dielectric layers. In some implementations, the lower level metal and dielectric layers 408 are provided and/or formed using a back end of line (BEOL) process.

The EM passive device 402 includes a base layer 410, a first passivation layer 411, a first dielectric layer 413, a second dielectric layer 415, a third dielectric layer 417, a first interconnect 412, a second interconnect 414, a third interconnect 416, a fourth interconnect 418, a fifth interconnect 420, a sixth interconnect 422, a seventh interconnect 424, an eighth interconnect 426, and a ninth interconnect 428. The base layer 410 may includes one of at least a substrate layer, a dielectric layer, and/or an encapsulation layer. The interconnects 412 and 414 may be configured as pads. The interconnects 416 and 418 may be configured as vias. The interconnects 420, 422 and 424 may be configured as traces. The interconnects 426 and 428 may be configured as vias (e.g., through substrate vias, through encapsulation layer vias, through dielectric vias).

The EM passive device 402 includes an EM passive component. An EM passive device and/or component may include one of at least an inductor, a coupler and/or a transformer. The EM passive component may be defined by one or more metal layers in the EM passive device 402. In some implementations, the EM passive device of the EM passive device 402 may be defined by at least a portion of the fifth interconnect 420, the sixth interconnect 422, and/or the seventh interconnect 424. For example, the interconnects 422 or 424 may be configured as an inductor. In another example, the combination of the interconnects 422 and 424 may be configured as a coupler or a transformer. An example of an inductor is further described in FIG. 7. The EM passive device 402 may be an EM means.

The encapsulation layer 404 encapsulates the die 401 and the EM passive device 402. Different implementations may use different materials for the encapsulation layer 404. In some implementations, the encapsulation layer 404 includes one of at least a mold, a polymer and/or an epoxy fill.

As shown in FIG. 4, a second passivation layer 431 is formed on the die 401 and the EM passive device 402. A first pad 432 and a second pad 434 are formed over the die 401. A third pad 442 and a fourth pad 444 are formed over the EM passive device 402.

The redistribution portion 403 is coupled to the die 401 and the EM passive device 402. In some implementations, the redistribution portion 403 is formed over the second passivation layer 431 and the pads 432, 434, 442, and 444. In some implementations, the second passivation layer 431 and the pads 432, 434, 442, and 444 are part of the redistribution portion 403. In some implementations, the redistribution portion 403 is configured to provide an electrical path between the die 401 and the EM passive device 402.

The redistribution portion 403 includes a first dielectric layer 433, a second dielectric layer 435, a third dielectric layer 437, a first interconnect 450, a second interconnect 452, a third interconnect 454, a fourth interconnect 456, a fifth interconnect 458, a first under-bump metallization (UBM) layer 460, a second UBM layer 462, and/or an electromagnetic (EM) shield 455. As shown in FIG. 4, the first interconnect 450, the second interconnect 452, and the third interconnect 454 include portions that are at least non-linear (e.g., portions that are at least U and/or V shaped).

As shown in FIG. 4, the die 401 is electrically coupled to the EM passive device 402 through the second pad 434, the interconnect 452 and the third pad 442. In some implementations, the second pad 434, the interconnect 452, and the third pad 442 provide an electrical path between the die 401 and the EM passive device 402. However, it should be noted that different implementations may provide different electrical paths between the die 401 and the EM passive device 402.

FIG. 4 illustrates that the EM shield 455 is located in the redistribution portion 403. In some implementations, the EM shield 455 is at least partially vertically aligned with one or more EM passive device 402. In some implementations, the EM shield 455 is at least partially vertically aligned with one or more EM passive components in the EM passive device 402. In some implementations, the EM shield 455 is configured to minimize and/or reduce the impact of the set of solder balls 405 (e.g., solder ball 405b) on the EM passive device 402 (e.g., on the EM passive device of the EM passive device 402). In some implementations, the EM shield 455 is electrically coupled to a ground signal, a solder ball and/or the EM passive device 402 (e.g., to the EM passive device of the EM passive device 402). An example of an EM shield is further described in detail in FIG. 8. The EM shield may be an EM shielding means.

Figure 5:
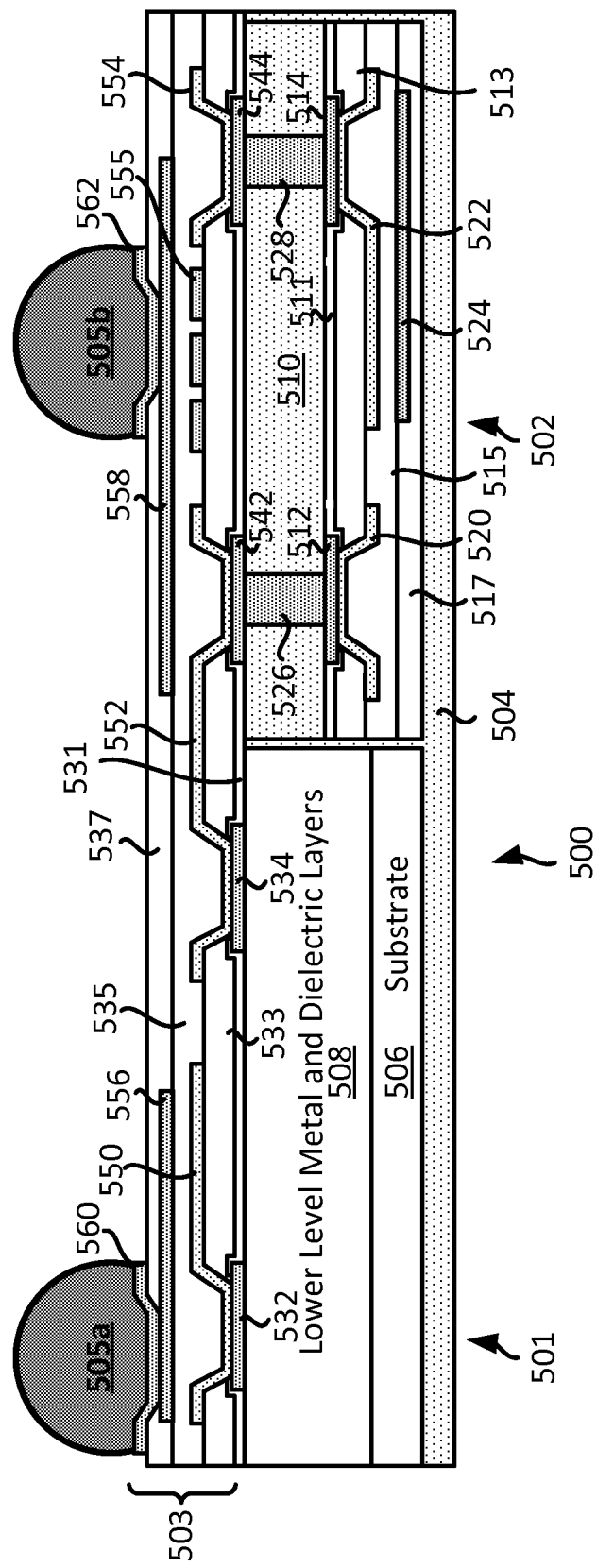
FIG. 5 illustrates an example of a profile view of an integrated device package comprising an electromagnetic passive device.

Exemplary Integrated Device Package Comprising an Electromagnetic (EM) Passive Device in an Encapsulation Layer, and an EM Shield FIG. 5 illustrates a profile view of an example of an integrated device package 500 that includes an electromagnetic (EM) passive device in an encapsulation layer. Specifically, FIG. 5 illustrates an integrated device package 500 that includes a die 501, an EM passive device 502, a redistribution portion 503, an encapsulation layer 504, and a set of solder balls 505 (e.g., solder balls 505a, 505b). In some implementations, the integrated device package 500 is a wafer level integrated device package.

The die 501 includes a substrate 506 and lower level metal and dielectric layers 508. In some implementations, the substrate 506 is a silicon substrate and/or wafer (e.g., silicon wafer). The lower level metal and dielectric layers 508 include lower level metal layers (e.g., M1 metal layer, M2 metal layer, M3 metal layer, M4 metal layer, M5 metal layer, M6 metal layer, M7 metal layer). The lower metal layers of the lower level metal and dielectric layers 508 include traces and/or vias. The lower level metal and dielectric layers 508 also include one or more dielectric layers. In some implementations, the lower level metal and dielectric layers 508 are provided and/or formed using a back end of line (BEOL) process.

The EM passive device 502 includes a base layer 510, a first passivation layer 511, a first dielectric layer 513, a second dielectric layer 515, a third dielectric layer 517, a first interconnect 512, a second interconnect 514, a third interconnect 520, a fourth interconnect 522, a fifth interconnect 524, an sixth interconnect 526, and a seventh interconnect 528. The base layer 510 may includes one of at least a substrate layer, a dielectric layer, and/or an encapsulation layer. The interconnects 512 and 514 may be configured as pads. The interconnects 520, 522 and 524 may be configured as traces. As shown in FIG. 5, the interconnects 520 and/or 522 include portions that are at least non-linear (e.g., portions that are at least U and/or V shaped). The interconnects 526 and 528 may be configured as vias (e.g., through substrate vias, through encapsulation layer vias, through dielectric vias).

The EM passive device 502 includes an EM passive component. An EM passive device and/or component may include one of at least an inductor, a coupler and/or a transformer. The EM passive component may be defined by one or more metal layers in the EM passive device 502. In some implementations, the EM passive component of the EM passive device 502 may be defined by at least a portion of the third interconnect 520, the fourth interconnect 522, and/or the fifth interconnect 524. For example, the interconnects 522 or 524 may be configured as an inductor. In another example, the combination of the interconnects 522 and 524 may be configured as a coupler or a transformer. An example of an inductor is further described in FIG. 7. The EM passive device 502 may be an EM means.

The encapsulation layer 504 encapsulates the die 501 and the EM passive device 502. Different implementations may use different materials for the encapsulation layer 504. In some implementations, the encapsulation layer 504 includes one of at least a mold, a polymer and/or an epoxy fill.

As shown in FIG. 5, a second passivation layer 531 is formed on the die 501 and the EM passive device 502. A first pad 532 and a second pad 534 are formed over the die 501. A third pad 542 and a fourth pad 544 are formed over the EM passive device 502.

The redistribution portion 503 is coupled to the die 501 and the EM passive device 502. In some implementations, the redistribution portion 503 is formed over the second passivation layer 531 and the pads 532, 534, 542, and 544. In some implementations, the second passivation layer 531 and the pads 532, 534, 542, and 544 are part of the redistribution portion 503. In some implementations, the redistribution portion 503 is configured to provide an electrical path between the die 501 and the EM passive device 502.

The redistribution portion 503 includes a first dielectric layer 533, a second dielectric layer 535, a third dielectric layer 537, a first interconnect 550, a second interconnect 552, a third interconnect 554, a fourth interconnect 556, a fifth interconnect 558, a first under-bump metallization (UBM) layer 560, a second UBM layer 562, and/or an electromagnetic (EM) shield 555. As shown in FIG. 5, the first interconnect 550, the second interconnect 552, and the third interconnect 554 include portions that are at least non-linear (e.g., portions that are at least U and/or V shaped).

As shown in FIG. 5, the die 501 is electrically coupled to the EM passive device 502 through the second pad 534, the interconnect 552 and the third pad 542. In some implementations, the second pad 534, the interconnect 552, and the third pad 542 provide an electrical path between the die 501 and the EM passive device 502. However, it should be noted that different implementations may provide different electrical path between the die 501 and the EM passive device 502.

FIG. 5 illustrates that the EM shield 555 is located in the redistribution portion 503. In some implementations, the EM shield 555 is at least partially vertically aligned with one or more EM passive device 502. In some implementations, the EM shield 555 is at least partially vertically aligned with one or more EM passive components in the EM passive device 502. In some implementations, the EM shield 555 is configured to minimize and/or reduce the impact of the set of solder balls 505 (e.g., solder ball 505b) on the EM passive device 502 (e.g., on the EM passive device of the EM passive device 502). In some implementations, the EM shield 555 is electrically coupled to a ground signal, a solder ball and/or the EM passive device 502 (e.g., to the EM passive device of the EM passive device 502). An example of an EM shield is further described in FIG. detail in 8. The EM shield may be an EM shielding means.

Figure 6:
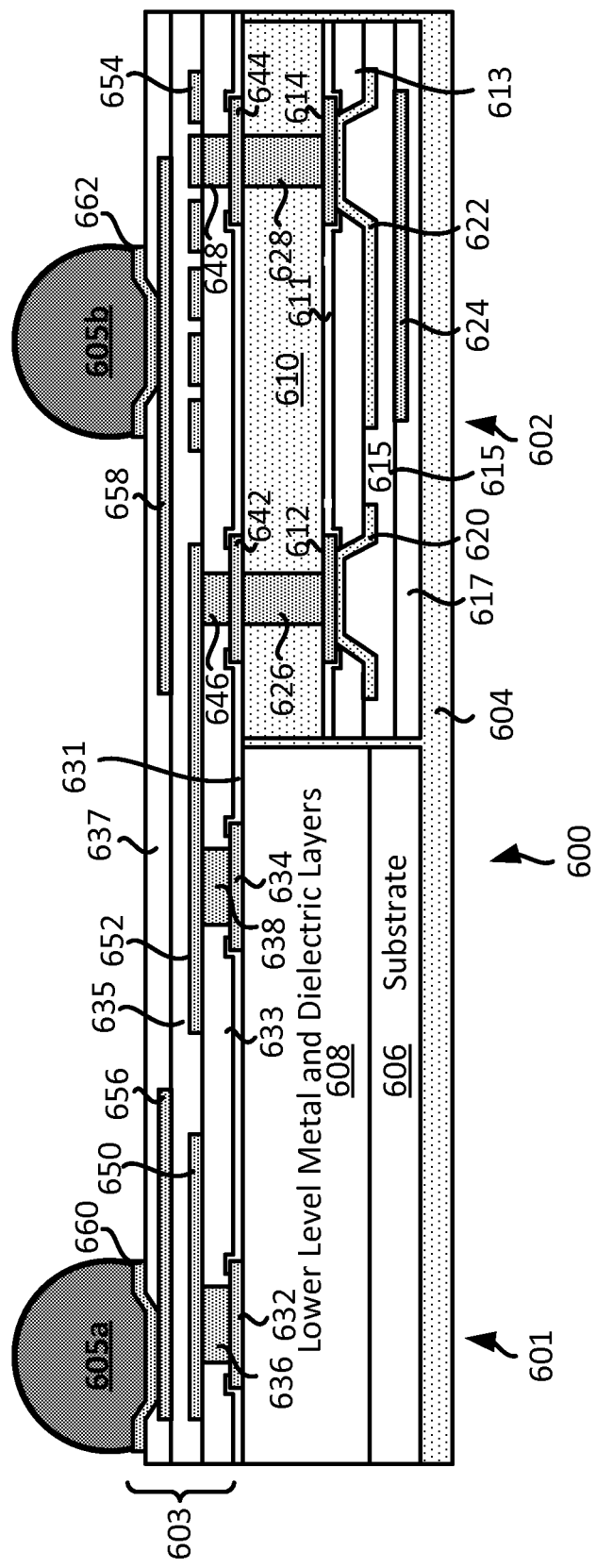
FIG. 6 illustrates an example of a profile view of an integrated device package comprising an electromagnetic passive device.

Exemplary Integrated Device Package Comprising an Electromagnetic (EM) Passive Device in an Encapsulation Layer, and an EM Shield FIG. 6 illustrates a profile view of an example of an integrated device package 600 that includes an electromagnetic (EM) passive device in an encapsulation layer. Specifically, FIG. 6 illustrates an integrated device package 600 that includes a die 601, an EM passive device 602, a redistribution portion 603, an encapsulation layer 604, and a set of solder balls 605 (e.g., solder balls 605a, 605b). In some implementations, the integrated device package 600 is a wafer level integrated device package.

The die 601 includes a substrate 606 and lower level metal and dielectric layers 608. In some implementations, the substrate 606 is a silicon substrate and/or wafer (e.g., silicon wafer). The lower level metal and dielectric layers 608 include lower level metal layers (e.g., M1 metal layer, M2 metal layer, M3 metal layer, M4 metal layer, M5 metal layer, M6 metal layer, M7 metal layer). The lower metal layers of the lower level metal and dielectric layers 608 include traces and/or vias. The lower level metal and dielectric layers 608 also include one or more dielectric layers. In some implementations, the lower level metal and dielectric layers 608 are provided and/or formed using a back end of line (BEOL) process.

The EM passive device 602 includes a base layer 610, a first passivation layer 611, a first dielectric layer 613, a second dielectric layer 615, a third dielectric layer 617, a first interconnect 612, a second interconnect 614, a third interconnect 620, a fourth interconnect 622, a fifth interconnect 624, an sixth interconnect 626, and a seventh interconnect 628. The base layer 610 may includes one of at least a substrate layer, a dielectric layer, and/or an encapsulation layer. The interconnects 612 and 614 may be configured as pads. The interconnects 620, 622 and 624 may be configured as traces. As shown in FIG. 6, the interconnects 620 and/or 622 include portions that are at least non-linear (e.g., portions that are at least U and/or V shaped). The interconnects 626 and 628 may be configured as vias (e.g., through substrate vias, through encapsulation layer vias, through dielectric vias).

The EM passive device 602 includes an EM passive component. An EM passive device and/or component may include one of at least an inductor, a coupler and/or a transformer. The EM passive component may be defined by one or more metal layers in the EM passive device 602. In some implementations, the EM passive component of the EM passive device 602 may be defined by at least a portion of the third interconnect 620, the fourth interconnect 622, and/or the fifth interconnect 624. For example, the interconnects 622 or 624 may be configured as an inductor. In another example, the combination of the interconnects 622 and 624 may be configured as a coupler or a transformer. An example of an inductor is further described in FIG. 7. The EM passive device 602 may be an EM means.

The encapsulation layer 604 encapsulates the die 601 and the EM passive device 602. Different implementations may use different materials for the encapsulation layer 604. In some implementations, the encapsulation layer 604 includes one of at least a mold, a polymer and/or an epoxy fill.

As shown in FIG. 6, a second passivation layer 631 is formed on the die 601 and the EM passive device 602. A first pad 632 and a second pad 634 are formed over the die 601. A third pad 642 and a fourth pad 644 are formed over the EM passive device 602.

The redistribution portion 603 is coupled to the die 601 and the EM passive device 602. In some implementations, the redistribution portion 603 is formed over the second passivation layer 631 and the pads 632, 634, 642, and 644. In some implementations, the second passivation layer 631 and the pads 632, 634, 642, and 644 are part of the redistribution portion 603. In some implementations, the redistribution portion 603 is configured to provide an electrical path between the die 601 and the EM passive device 602.

The redistribution portion 603 includes a first dielectric layer 633, a second dielectric layer 635, a third dielectric layer 637, a first via 636, a second via 638, a third via 646, a fourth via 648, a first interconnect 650, a second interconnect 652, a third interconnect 656, a fourth interconnect 658, a first under-bump metallization (UBM) layer 660, a second UBM layer 662, and/or an electromagnetic (EM) shield 654.

As shown in FIG. 6, the die 601 is electrically coupled to the EM passive device 602 through the second pad 634, the second via 638, the interconnect 652, the third via 646, and the third pad 642. In some implementations, the second pad 634, the second via 638, the interconnect 652, the third via 646, and the third pad 642 provide an electrical path between the die 601 and the EM passive device 602. However, it should be noted that different implementations may provide different electrical paths between the die 601 and the EM passive device 602.

FIG. 6 illustrates that the EM shield 654 is located in the redistribution portion 603. In some implementations, the EM shield 654 is at least partially vertically aligned with one or more EM passive device 602. In some implementations, the EM shield 654 is at least partially vertically aligned with one or more EM passive components in the EM passive device 602. In some implementations, the EM shield 654 is configured to minimize and/or reduce the impact of the set of solder balls 605 (e.g., solder ball 605b) on the EM passive device 602 (e.g., on the EM passive device of the EM passive device 602). In some implementations, the EM shield 654 is electrically coupled to a ground signal, a solder ball and/or the EM passive device 602 (e.g., to the EM passive device of the EM passive device 602). An example of an EM shield is further described in detail in FIG. 8. The EM shield may be an EM shielding means.

Exemplary Configuration of Electromagnetic (EM) Passive Component and EM Shield

Figure 7:
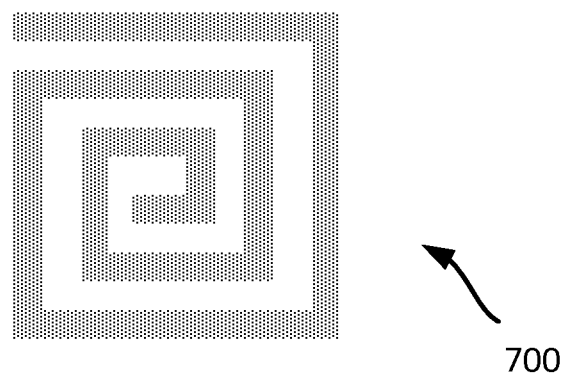
FIG. 7 illustrates a plan view of an inductor configuration.

FIG. 7 illustrates a plan view of an exemplary electromagnetic (EM) passive component 700 that may be implemented in an integrated device package. The EM passive component 700 may be part of an EM passive device. The EM passive component 700 shown is a spiral inductor. However, different implementations may use different shapes and/or configurations of an inductor. In some implementations, two or more inductors (e.g., spiral inductors) may be used in combination to form a coupler or a transformer in a redistribution portion of an integrated device package. The EM passive component 700 may be an EM means. The EM passive component 700 may be formed by one or more metal layers (e.g., redistribution metal layers). In some implementations, an EM passive component may include a radio frequency (RF) passive component. Similarly, an EM passive device may include a radio frequency (RF) passive device.

Figure 8:
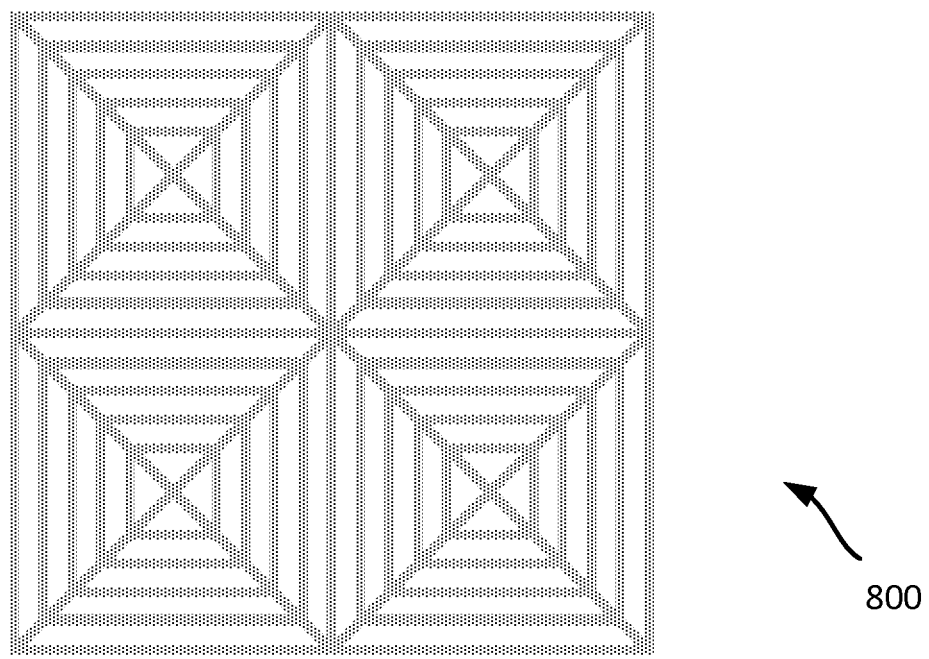
FIG. 8 illustrates a plan view of an electromagnetic shield configuration.

FIG. 8 illustrates a plan view of an exemplary electromagnetic (EM) shield 800 that may be implemented in an integrated device package. It should be noted that the EM shield 800 is merely one design of many possible designs of an EM shield. As such, an EM shield implemented in an integrated device package should not be limited by the EM shield 800 of FIG. 8. The EM shield 800 may be an EM shielding means. In some implementations, the EM shield 800 is a radio frequency (RF) shield/RF shielding means.

An EM shield provides several technical advantages in an integrated device package. In some instances, a solder ball may adversely affect the performance of a nearby EM passive device. However, removing solder ball(s) near an EM passive device may not be possible or practical due to design constraints and/or requirements. In such instances, an EM shield provides a practical solution for providing a high inductance and/or high Q factor EM passive device. This is because, an EM shield may reduce, minimize, or shield the effect of solder ball(s) on the performance of a nearby EM passive device and/or EM passive component. For example, an EM shield may reduce, minimize, or shield the disruption of solder balls on the magnetic flux of the EM passive device. By doing so, the EM shield may help with providing an EM passive device with a high inductance and a high Q factor, without having to remove solder ball(s) near the EM passive device.

Exemplary Sequence for Providing/Fabricating an Electromagnetic (EM) Passive Device In some implementations, providing/fabricating an electromagnetic (EM) passive device includes several processes. FIG. 9 (which includes FIGS. 9A-9D) illustrates an exemplary sequence for providing/fabricating an EM passive device. In some implementations, the sequence of FIGS. 9A-9D may be used to provide/fabricate the EM passive device of FIGS. 3-6 and/or other EM passive devices in the present disclosure. However, for the purpose of simplification, FIGS. 9A-9D will be described in the context of providing/fabricating the EM passive device of FIG. 3.

It should be noted that the sequence of FIGS. 9A-9D may combine one or more stages in order to simplify and/or clarify the sequence for providing EM passive device. In some implementations, the order of the processes may be changed or modified.

Figure 9A:
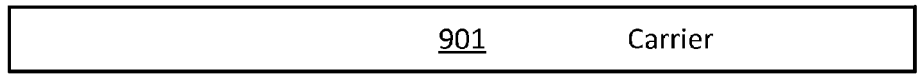
FIG. 9 (comprising FIGS. 9A-9D) illustrates an exemplary sequence for providing/fabricating an electromagnetic passive device.
Figure 9A:
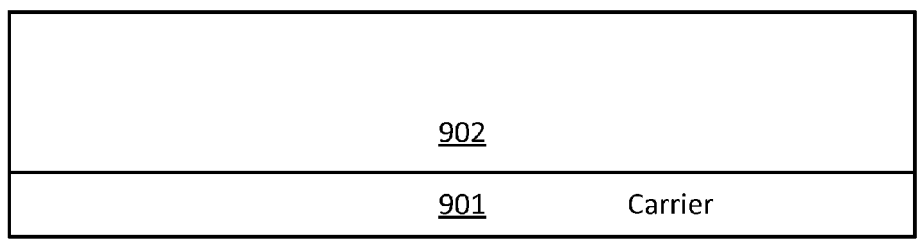
Figure 9A:
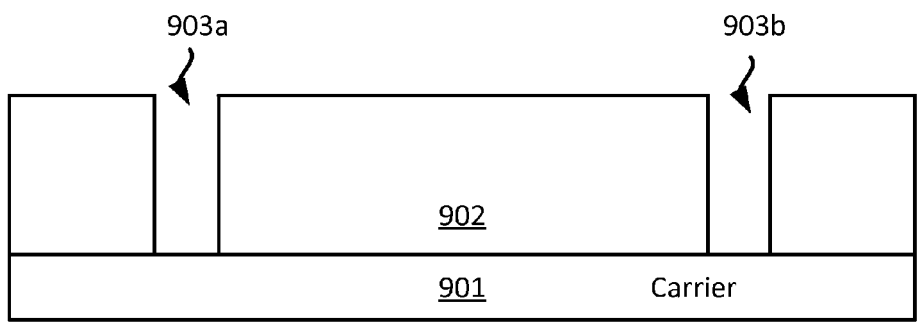
Figure 9A:
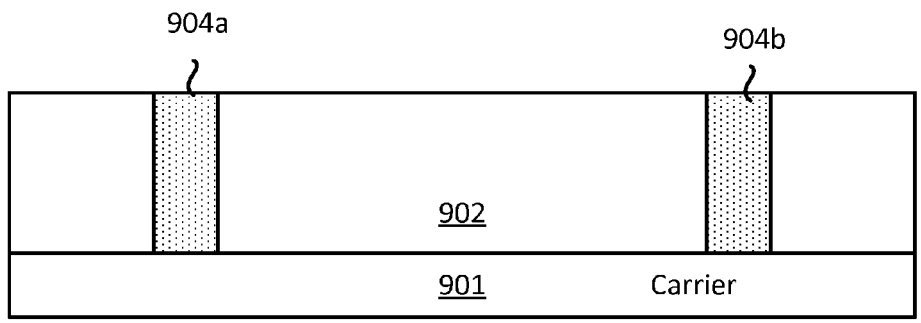

Stage 1 of FIG. 9A, illustrates a state after a carrier 901 is provided. In some implementations, the carrier 901 is provided by a supplier. In some implementations, the carrier 901 is fabricated (e.g., formed). In some implementations, the carrier 901 is a silicon substrate and/or wafer (e.g., silicon wafer).

Stage 2 illustrates a state after a base layer 902 is provided. In some implementations, providing the base layer 902 include forming the base layer on the carrier 901. Different implementations may use different materials for the base layer 902. In some implementations, the base layer 902 is at least one of a dielectric layer, and/or an encapsulation layer.

Stage 3 illustrates a state after cavities 903 (e.g., cavity 903a, cavity 903b) are formed in the base layer 902. Different implementations may use different processes for forming cavities in the base layer 902. In some implementations, a laser may be used to form the cavities. In some implementations, a photo-etching process is used to form the cavities.

Stage 4 illustrates after vias 904 (e.g., via 904a, via 904b) are formed in the base layer 902. Specifically, the vias 904 are formed in the cavities 903 of the base layer 902. In some implementations, the vias 904 are metal layer(s) that are formed using one or more plating processes. FIGS. 13-16 illustrate examples of providing one or more metal layers using several plating processes.

Figure 9B:
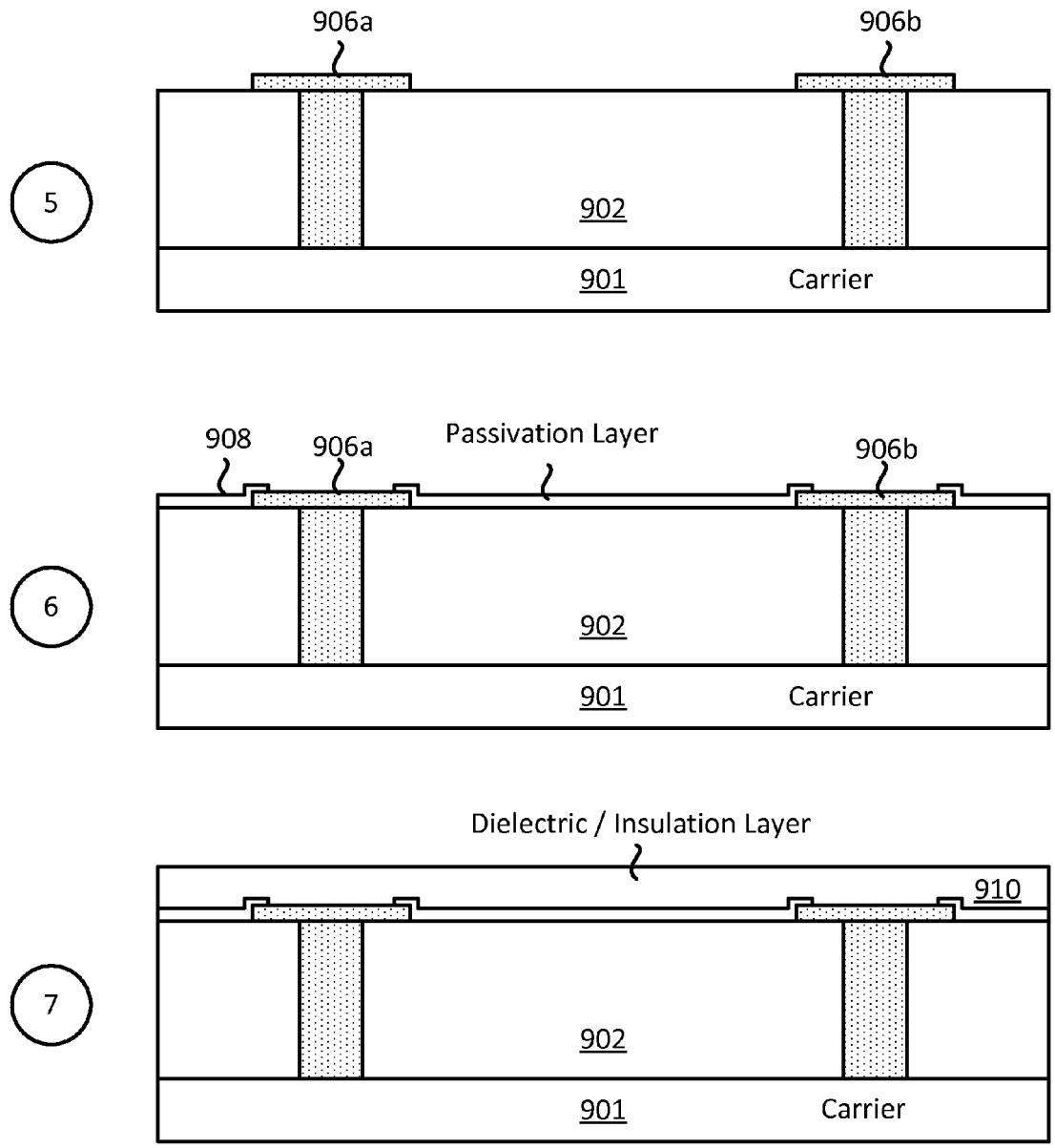

Stage 5, as shown in FIG. 9B, illustrates a state after a first metal layer 906 (comprising 906a, 906b) is provided (e.g., formed) on the base layer 902. The first metal layer 906 may form different components. As show at stage 5, the first metal layer 906 forms a first pad 906a, and a second pad 906b.

Stage 6 illustrates a state after a passivation layer 908 is provided (e.g., formed) over the base layer 902 and the metal layer 906. In some implementations, providing the passivation layer 908 includes forming the passivation layer 908 on the base layer 902 and the metal layer 906 and selectively etching portions of the passivation layer 908 over the metal layer 906 (e.g., selectively etching portions of the passivation layer 908 over of the pads).

Stage 7 illustrates a state after a first dielectric layer 910 is provided on the passivation layer 908 and the metal layer 906.

Figure 9C:
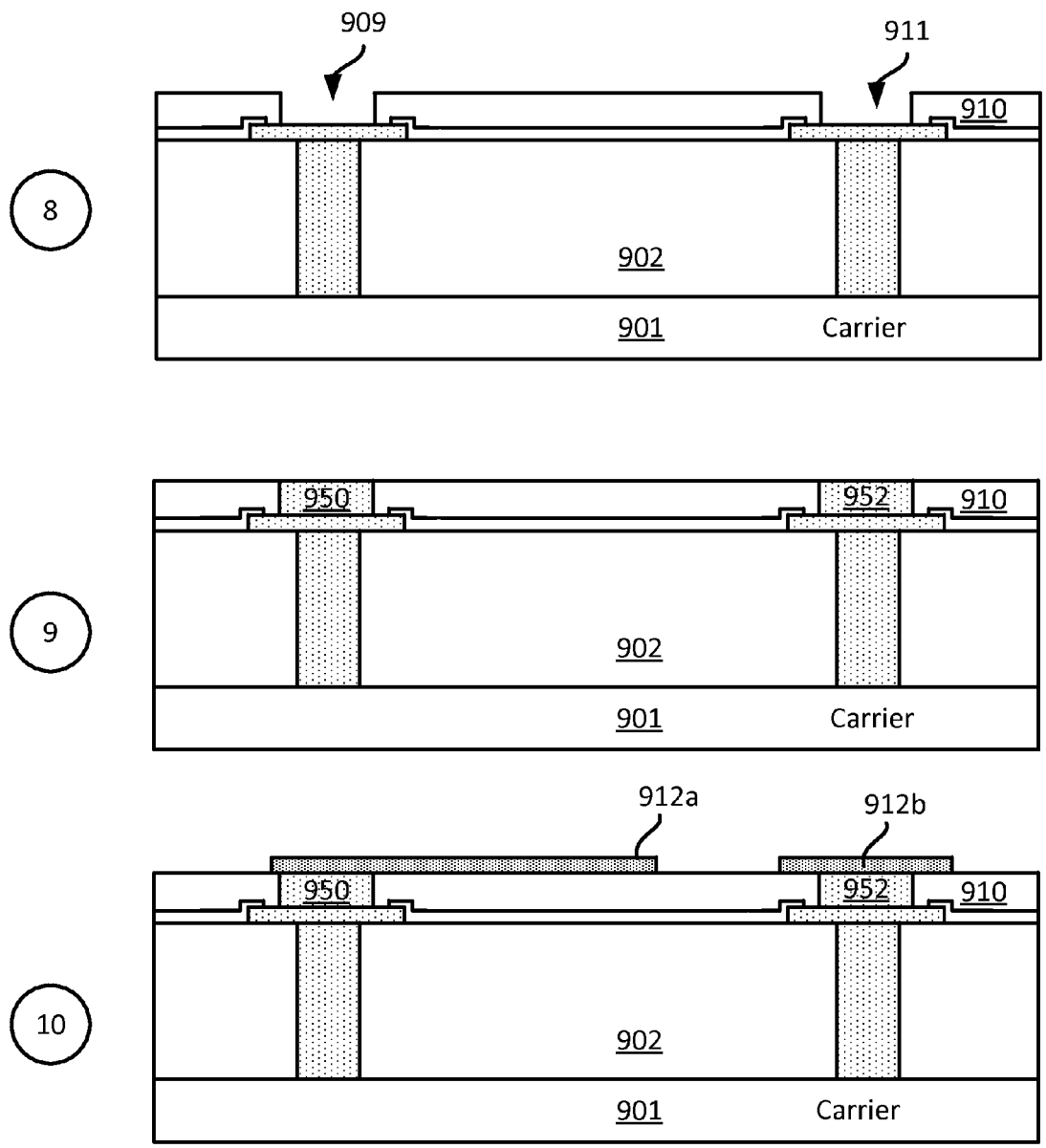

Stage 8, as shown in FIG. 9C, illustrates a state after portions of the first dielectric layer 910 are selectively removed (e.g., etched). As shown at stage 8, portions of the first dielectric layer 910 are selectively etched to form a cavity 909 and a cavity 911 in the first dielectric layer 910 over the pads.

Stage 9 illustrates a state after a first via 950 and a second via 952 are respectively formed in the cavities 909 and 911. The first via 950 is coupled to the pad 906a, and the second via 952 is coupled to the pad 906b.

Stage 10 illustrates a state after a first redistribution layer 912 is provided (e.g., formed) on the first dielectric layer 910. As shown at stage 10, the first redistribution layer 912 includes a first redistribution interconnect 912a and a second redistribution interconnect 912b. The first redistribution interconnect 912a is coupled to the first via 950. The second redistribution interconnect 912b is formed on the second via 952. In some implementations, at least a portion of the first and/or second redistribution interconnects 912a-b are configured to operate as an EM passive component (e.g., inductor, spiral inductor).

In some implementations, providing the first redistribution layer 912 includes forming (e.g., plating) one or more metal layers (e.g., seed layer and metal layer) and selectively etching portions of the one or more metal layers. FIGS. 13-16 illustrate examples of providing one or more metal layers using several plating processes.

Figure 9D:
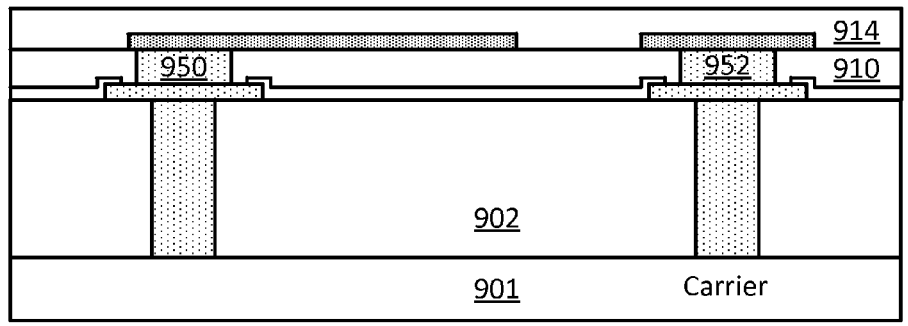
Figure 9D:
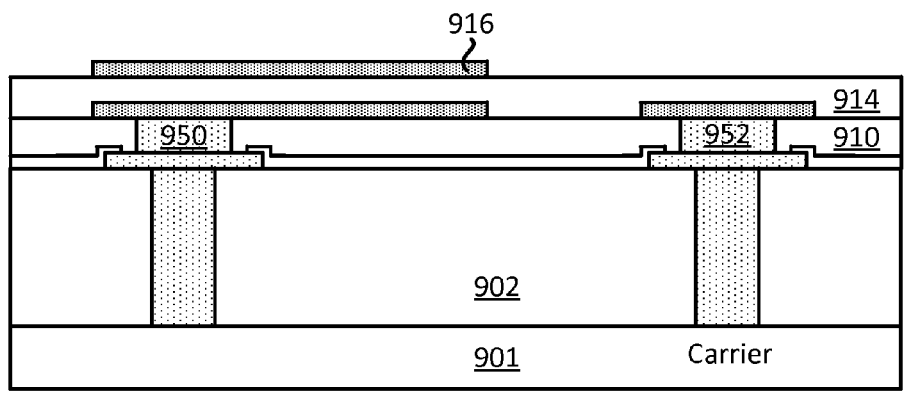
Figure 9D:
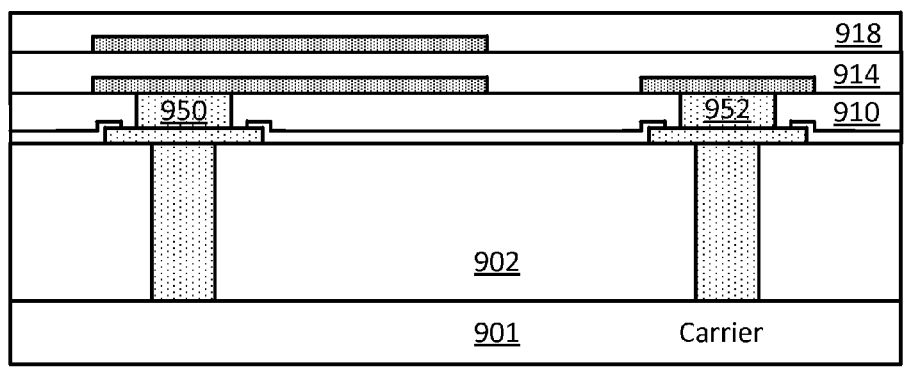

Stage 11, as shown in FIG. 9D, illustrates a state after a second dielectric layer 914 is provided on the first dielectric layer 910 and the first redistribution layer 912.

Stage 12 illustrates a state after a second redistribution layer 916 is provided (e.g., formed) on the second dielectric layer 914. The second redistribution layer 916 may be electrically coupled to the second redistribution interconnect 912b (e.g., through a via which is not visible). In some implementations, at least a portion of the second redistribution layer 916 is configured to operate as an EM passive component (e.g., inductor, spiral inductor). FIGS. 13-16 illustrate examples of providing one or more metal layers (e.g., redistribution layer) using several plating processes.

Stage 13 illustrates a state after a third dielectric layer 918 is provided on the second dielectric layer 914 and the second redistribution layer 916. In some implementations, the carrier 901 may be removed leaving behind an EM passive device. Different implementations may remove the carrier 901 differently.

Figure 10:
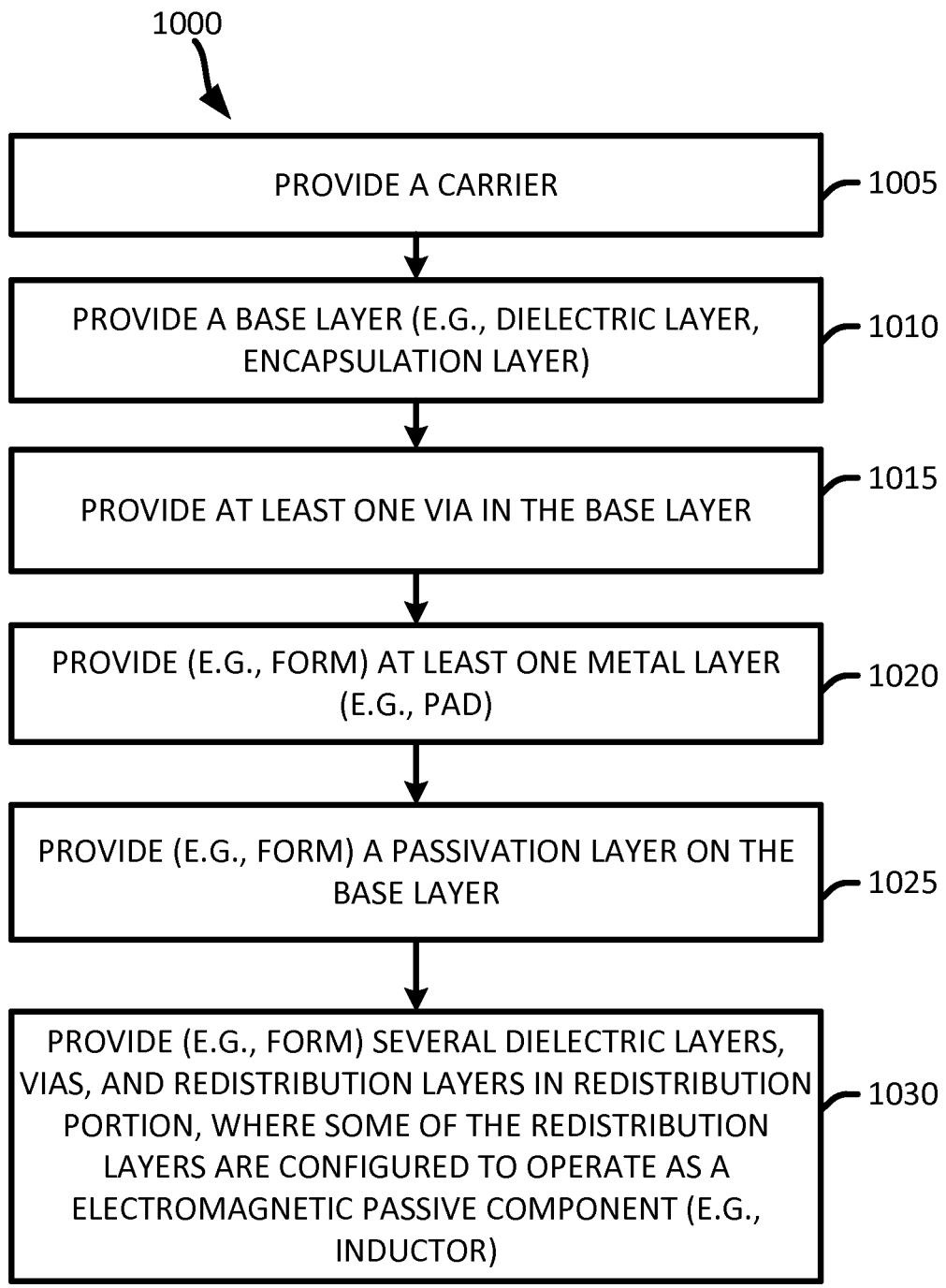
FIG. 10 illustrates an exemplary flow diagram of a method for providing/fabricating an electromagnetic passive device.

Exemplary Method for Providing/Fabricating an Electromagnetic (EM) Passive Device FIG. 10 illustrates an exemplary flow diagram for providing/fabricating an electromagnetic (EM) passive device. In some implementations, the method of FIG. 10 may be used to provide/fabricate the EM passive device of FIGS. 3-6 and/or other EM passive devices in the present disclosure.

It should be noted that the flow diagram of FIG. 10 may combine one or more step and/or processes in order to simplify and/or clarify the method for providing EM passive device. In some implementations, the order of the processes may be changed or modified.

The method provides (at 1005) a carrier. In some implementations, the carrier is provided by a supplier. In some implementations, the carrier is fabricated (e.g., formed). In some implementations, the carrier is a silicon substrate and/or wafer (e.g., silicon wafer).

The method then provides (at 1010) a base layer on the carrier. In some implementations, providing the base layer include forming the layer on the carrier. Different implementations may use different materials for the base layer. In some implementations, the base layer is at least one of a dielectric layer, and/or an encapsulation layer.

The method further provides (at 1015) at least one via. Different implementations may provide the vias differently. In some implementations, providing the via(s) includes forming at least one cavity in the base layer and filling the cavity with at least one metal layer to define the vias. Different implementations may use different processes for forming cavities in the base layer. In some implementations, a laser may be used to form the cavities. In some implementations, a photo-etching process is used to form the cavities. In some implementations, the vias are metal layer(s) that are formed using one or more plating processes. FIGS. 13-16 illustrate examples of providing one or more metal layers using several plating processes.

The method provides (at 1020) at least one pad. In some implementations, the pad is formed such that they couple to a via in the base layer.

The method provides (at 1025) a passivation layer on the base layer, leaving an opening above the pads. In some implementations, providing the passivation layer includes forming the passivation layer on the base layer and the metal layer (e.g., pads) and selectively etching portions of the passivation layer over the metal layer (e.g., selectively etching portions of the passivation layer over of the pads).

The method provides (at 1030) vias, redistribution layers, and dielectric layers on the passivation layer. In some implementations, at least a portion of the redistribution layers are configured to operate as an EM passive component (e.g., inductor). In some implementations, a dielectric layer is formed in the passivation layer, and portions of the dielectric layer are selectively removed (e.g., etched) to form cavities in the dielectric layer. In some implementations, providing a redistribution layer includes forming (e.g., plating) one or more metal layers (e.g., seed layer and metal layer) and selectively etching portions of the one or more metal layers. FIGS. 13-16 illustrate examples of providing one or more metal layers using several plating processes.

Exemplary Sequence for Providing/Fabricating an Integrated Device Package that Includes an Electromagnetic (EM) Passive Device In some implementations, providing/fabricating an integrated device package with an electromagnetic (EM) passive device includes several processes. FIG. 11 (which includes FIGS. 11A-11D) illustrates an exemplary sequence for providing/fabricating an integrated device package with an EM passive device. In some implementations, the sequence of FIGS. 11A-11D may be used to provide/fabricate the integrated device package of FIGS. 3-6 and/or other integrated device packages in the present disclosure. However, for the purpose of simplification, FIGS. 11A-11D will be described in the context of providing/fabricating the integrated device package of FIG. 3.

It should be noted that the sequence of FIGS. 11A-11D may combine one or more stages in order to simplify and/or clarify the sequence for providing an integrated device package. In some implementations, the order of the processes may be changed or modified.

Figure 11A:
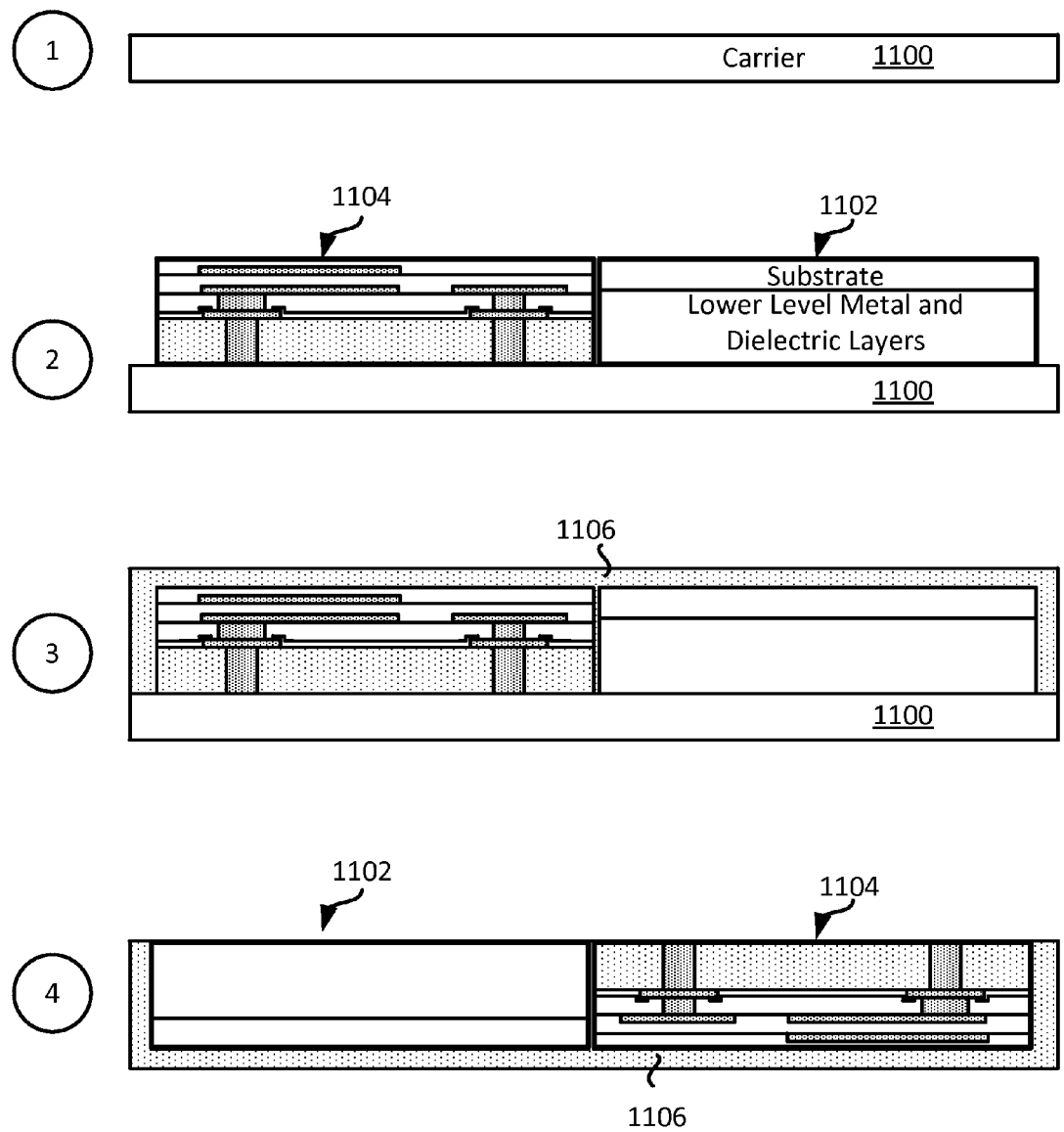
FIG. 11 (comprising FIGS. 11A-11D) illustrates an exemplary sequence for providing/fabricating an integrated device package that includes an electromagnetic passive device.

Stage 1 of FIG. 11A, illustrates a state after a carrier 1100 is provided. In some implementations, the carrier 1100 is provided by a supplier. In some implementations, the carrier 1100 is fabricated (e.g., formed). In some implementations, the carrier 1100 is a silicon substrate and/or wafer (e.g., silicon wafer).

Stage 2 illustrates a state after a die 1102 and an EM passive device 1104 are provided. The die 1102 may include a substrate, several lower metal layers, and several dielectric layers, as described in FIG. 3. The EM passive device 1104 may include an EM passive component (e.g., inductor), as described in FIG. 3. Examples of the die 1102 include the dies shown in FIGS. 3-6. Similarly, examples of the EM passive device 1104 include the EM passive device shown in FIGS. 3-6.

As shown at stage 2, the die 1102 and the EM passive device 1104 are coupled to a surface of the carrier 1100. In some implementations, an adhesive is used to mechanically couple the die 1102 and the EM passive device 1104 to the carrier 1100. In some implementations, the EM passive device 1104 is positioned laterally (e.g., to the side) of the die 1102. In some implementations, more than one EM passive device 1104 may be provided on the carrier 1100.

As further shown in stage 2, the die 1102 is coupled to the carrier 1100 such that the active side (e.g., front side) of the die 1102 is coupled to the carrier 1100. That is, the substrate of the die 1102 (e.g., back side of the die 1102) is furthest away from the carrier 1100. The EM passive device 1104 is coupled to the carrier 1100 such that the EM passive component inside is furthest away from the carrier 1100. However, in some implementations, the EM passive device 1104 may be coupled to the carrier 1100 differently (e.g., different side, different orientation).

Stage 3 illustrates a state after an encapsulation layer 1106 is provided. The encapsulation layer 1106 encapsulates or covers the die 1102 and the EM passive device 1104. In some implementations, the encapsulation layer 1106 includes one of at least a mold, a polymer and/or an epoxy fill.

Stage 4 illustrates a state after the carrier 1100 is removed, leaving the die 1102, the EM passive device 1104, and the encapsulation layer 1106. In some implementations, the carrier 1100 is removed through an etching process. However, different implementations may use different processes to remove the carrier 1100.

Figure 11B:
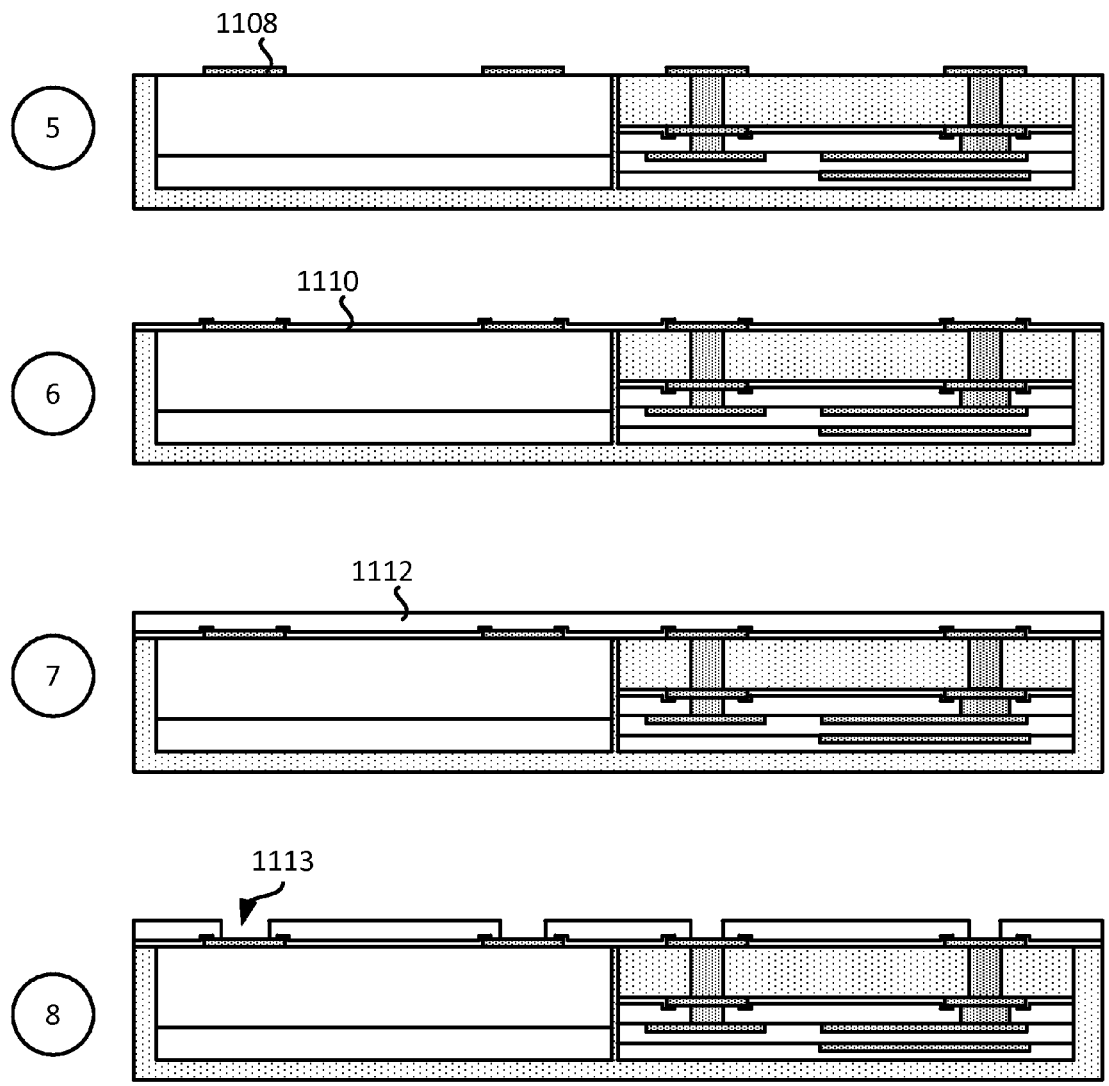

Stage 5, as shown in FIG. 11B, illustrates a state after a first metal layer 1108 is provided (e.g., formed) on the die 1102 and the EM passive device 1104. The first metal layer 1108 may form different components of an integrated device package. For example, portions of the first metal layer 1108 may form one or more pads, where each pad is electrically coupled to the die 1102 and/or the EM passive device 1104.

Stage 6 illustrates a state after a passivation layer 1110 is provided (e.g., formed) over the die 1102, the EM passive device 1104, and the first metal layer 1108. In some implementations, providing the passivation layer 1110 includes forming the passivation layer 1110 on the die 1102, the EM passive device 1104, and the first metal layer 1108 and selectively etching portions of the passivation layer 1110 over the metal layer 1108 (e.g., selectively etching portions of the passivation layer 1110 over of the pads).

Stage 7 illustrates a state after a first dielectric layer 1112 is provided (e.g., formed) on the passivation layer 1110 and the metal layer 1108.

Stage 8 illustrates a state after portions of the first dielectric layer 1112 are selectively removed (e.g., etched) to form one or more cavities in the first dielectric layer 1112. As shown at stage 8, portions of the first dielectric layer 1112 are selectively etched to form a cavity 1113 in the first dielectric layer 1112 over the pad.

Figure 11C:
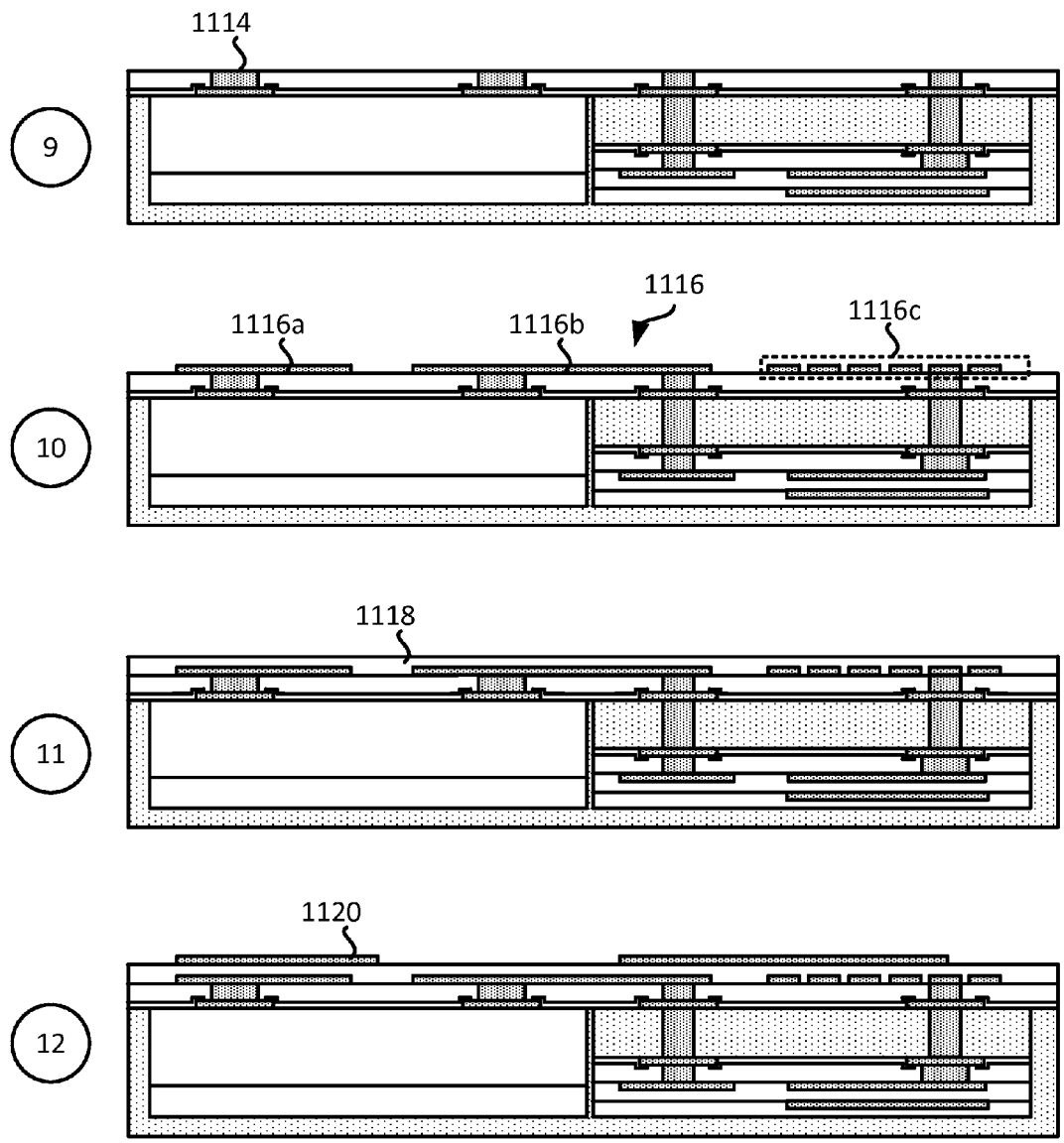

Stage 9, as shown in FIG. 11C, illustrates a state after vias are formed in the first dielectric layer 1112. Specifically, stage 9 illustrates a state after a first via 1114 is formed in the cavity 1113. The first via 1114 is coupled to the pad of the first metal layer 1108.

Stage 10 illustrates a state after a first redistribution layer 1116 is provided (e.g., formed) on the first dielectric layer 1112. As shown at stage 10, the first redistribution layer 1116 includes a first redistribution interconnect 1116a, a second redistribution interconnect 1116b, and an electromagnetic (EM) shield 1116c. In some implementations, providing the first redistribution layer 1116 includes forming (e.g., plating) one or more metal layers (e.g., seed layer and metal layer) and selectively etching portions of the one or more metal layers. FIGS. 13-16 illustrate examples of providing one or more metal layers using several plating processes.

Stage 11 illustrates a state after a second dielectric layer 1118 is provided on the first dielectric layer 1112 and the first redistribution layer 1116.

Stage 12 illustrates a state after a second redistribution layer 1120 is provided (e.g., formed) on the second dielectric layer 1118. FIGS. 13-16 illustrate examples of providing one or more metal layers (e.g., redistribution layer) using several plating processes.

Figure 11D:
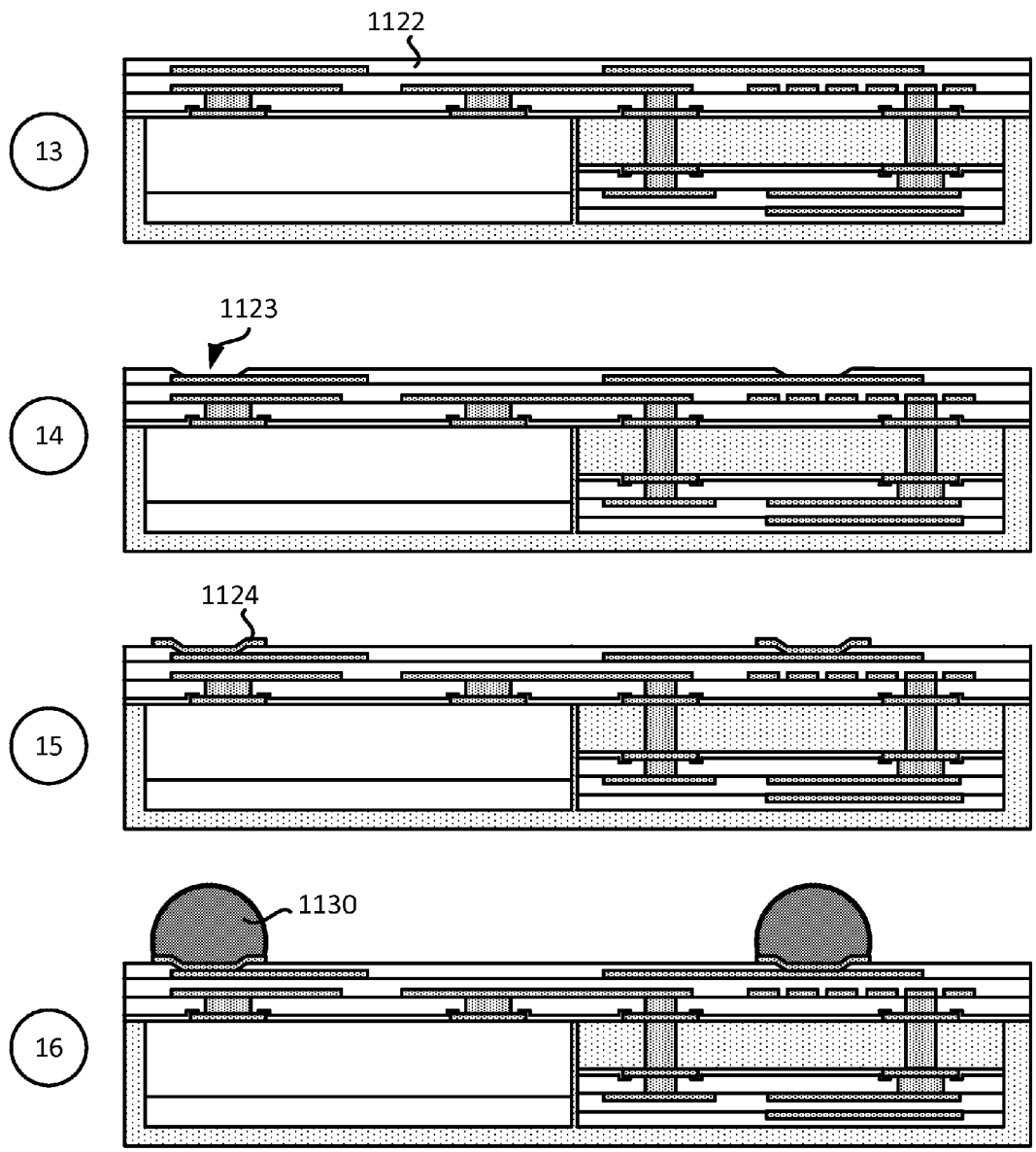

Stage 13, as shown in FIG. 11D, illustrates a state after a third dielectric layer 1122 is provided on the second dielectric layer 1118 and the second redistribution layer 1120.

Stage 14 illustrates a state after portions of the third dielectric layer 1122 are selectively removed (e.g., etched). As shown at stage 14, portions of the third dielectric layer 1122 are selectively etched to form a cavity 1123 in the third dielectric layer 1122.

Stage 15 illustrates a state after an under-bump metallization (UBM) layer 1124 is provided (e.g., formed) on the third dielectric layer 1122 and the second redistribution layer 1120. In some implementations, the UBM layer 1124 is optional.

FIGS. 13-16 illustrate examples of providing one or more metal layers (e.g., UBM layer) using several plating processes.

Stage 16 illustrates a state after a solder ball 1130 is provided (e.g., coupled) to the UBM layer 1124. In some implementations, the UBM layer 1124 is optional. In such instances, the solder ball 1130 may be directly coupled to the second redistribution layer 1120.

Figure 12:
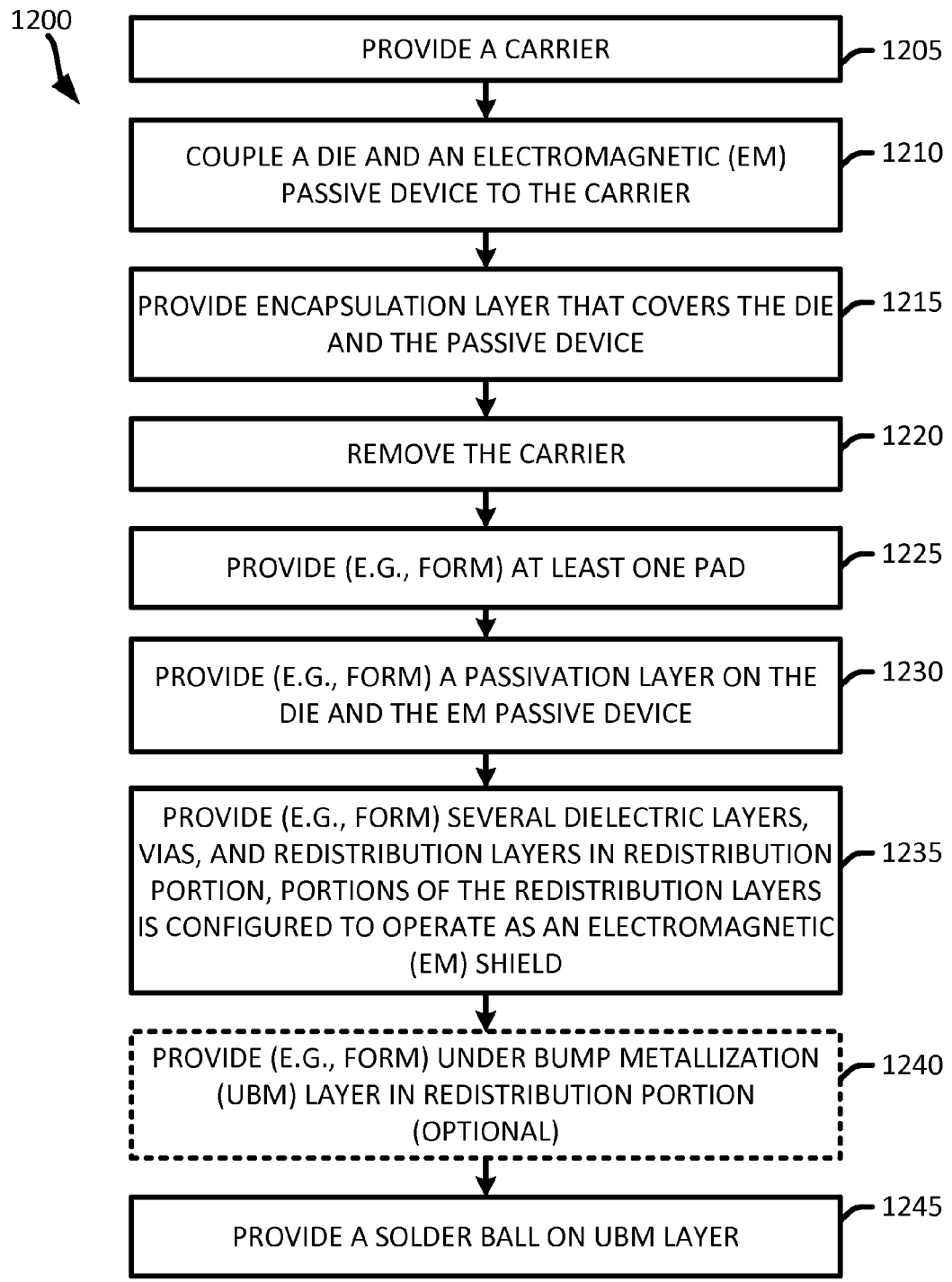
FIG. 12 illustrates an exemplary flow diagram of a method for providing/fabricating an integrated device package that includes an electromagnetic passive device.

Exemplary Method for Providing/Fabricating an Integrated Device Package that Includes an Electromagnetic (EM) Passive Device FIG. 12 illustrates an exemplary flow diagram of a method for providing/fabricating an integrated device package with an EM passive device. In some implementations, the method of FIG. 12 may be used to provide/fabricate the integrated device package of FIGS. 3-6 and/or other integrated device packages in the present disclosure.

It should be noted that the flow diagram of FIG. 10 may combine one or more step and/or processes in order to simplify and/or clarify the method for providing an integrated device package. In some implementations, the order of the processes may be changed or modified.

The method provides (at 1205) a carrier. In some implementations, the carrier is provided by a supplier. In some implementations, the carrier is fabricated (e.g., formed). In some implementations, the carrier is a silicon substrate and/or wafer (e.g., silicon wafer).

The method then couples (at 1210) a die and an EM passive device to the carrier. The die may include a substrate, several lower metal layers, and several dielectric layers, as described in FIG. 3. The EM passive device may include an EM passive component (e.g., inductor), as described in FIG. 3. Examples of dies include the dies shown in FIGS. 3-6. Similarly, examples of EM passive devices include the EM passive device shown in FIGS. 3-6.

In some implementations, an adhesive is used to mechanically couple the die and the EM passive device to the carrier. In some implementations, the EM passive device is positioned laterally (e.g., to the side) of the die. In some implementations, more than one EM passive device may be provided on the carrier.

In some implementations, the die is coupled to the carrier such that the active side of the die is coupled to the carrier. That is, the substrate of the die is furthest away from the carrier. The EM passive device is coupled to the carrier is coupled to the carrier such that the EM passive component inside is furthest away from the carrier. However, in some implementations, the EM passive device may be coupled to the carrier differently (e.g., different side, different orientation).

The method provides (at 1215) an encapsulation layer, such that the encapsulation layer encapsulates or covers the die and the EM passive device. In some implementations, the encapsulation layer includes one of at least a mold, a polymer and/or an epoxy fill.

The method removes (at 1220) the carrier, leaving the die, the EM passive device, and the encapsulation layer. In some implementations, the carrier is removed through an etching process. However, different implementations may use different processes to remove the carrier.

The method then provides (at 1225) a first metal layer on the die and the EM passive device. The first metal layer may form different components of an integrated device package. For example, portions of the first metal layer may form one or more pads, where each pad is electrically coupled to the die and/or the EM passive device.

The method provides (at 1230) a passivation layer over the die, the EM passive device, and the first metal layer. In some implementations, providing the passivation layer includes forming the passivation layer on the die, the EM passive device, and the first metal layer, and selectively etching portions of the passivation layer over the first metal layer (e.g., selectively etching portions of the passivation layer over of the pads).

The method then provides (at 1235) several vias, redistribution layers and several dielectric layers. In some implementations, this includes forming a first dielectric layer and selectively removing (e.g., etched) portions of the first dielectric layer to form one or more cavities in the first dielectric layer. In some implementations, vias are formed in the first dielectric layer. Specifically, vias are formed in the cavities. In some implementations, portions of one or more of the redistribution layers are configured to operate as an electromagnetic (EM) shield. In some implementations, providing the redistribution layer(s) forming (e.g., plating) one or more metal layers (e.g., seed layer and metal layer) and selectively etching portions of the one or more metal layers. FIGS. 13-16 illustrate examples of providing one or more metal layers using several plating processes.

The method then optionally provides (at 1240) an under-bump metallization (UBM) layer, such that the UBM layer is electrically coupled to one or more redistribution layers. FIGS. 13-16 illustrate examples of providing one or more metal layers (e.g., UBM layer) using several plating processes.

The method provides (at 1245) a solder ball to (e.g., couples to) the UBM layer. In some implementations, the UBM layer 1224 is optional. In such instances, the solder ball may be directly coupled to one of the redistribution layers.

Exemplary Semi-Additive Patterning (SAP) Process

Various interconnects (e.g., traces, vias, pads) are described in the present disclosure. These interconnects may be formed in the integrated device package, the substrate and/or the redistribution portion. In some implementations, these interconnects may includes one or more metal layers. For example, in some implementations, these interconnects may include a first metal seed layer and a second metal layer. The metal layers may be provided (e.g., formed) using different plating processes. Below are detailed examples of interconnects (e.g., traces, vias, pads) with seed layers and how these interconnects may be formed using different plating processes.

Different implementations may use different processes to form and/or fabricate the metal layers (e.g., interconnects, redistribution layer, under bump metallization layer). In some implementations, these processes include a semi-additive patterning (SAP) process and a damascene process. These various different processes are further described below.

Figure 13:
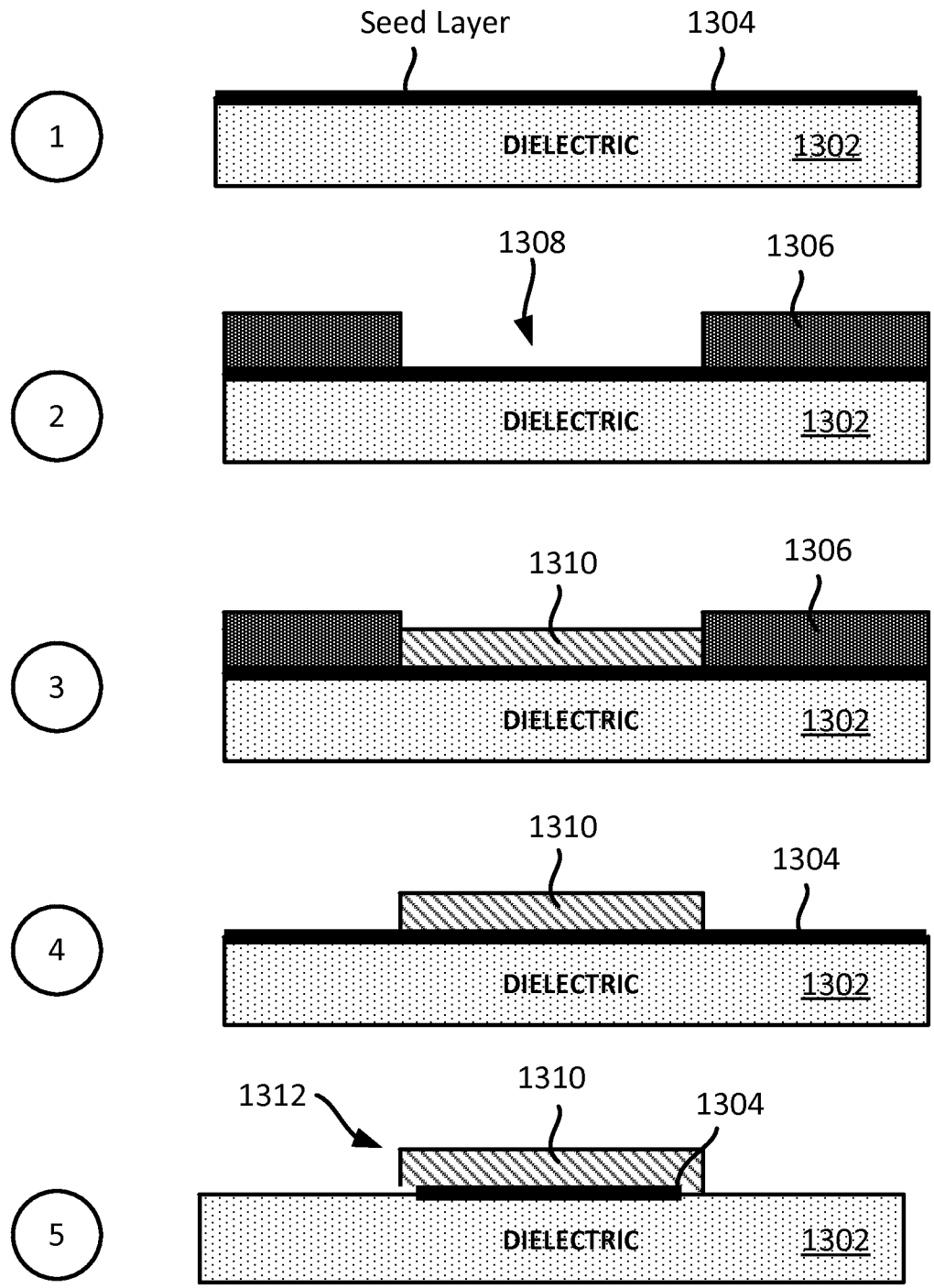
FIG. 13 illustrates an example of a semi-additive patterning (SAP) process.

FIG. 13 illustrates a sequence for forming an interconnect using a semi-additive patterning (SAP) process to provide and/or form an interconnect in one or more dielectric layer(s). As shown in FIG. 13, stage 1 illustrates a state of an integrated device (e.g., substrate) after a dielectric layer 1302 is provided (e.g., formed). In some implementations, stage 1 illustrates that the dielectric layer 1302 includes a first metal layer 1304. The first metal layer 1304 is a seed layer in some implementations. In some implementations, the first metal layer 1304 may be provided (e.g., formed) on the dielectric layer 1302 after the dielectric layer 1302 is provided (e.g., received or formed). Stage 1 illustrates that the first metal layer 1304 is provided (e.g., formed) on a first surface of the dielectric layer 1302. In some implementations, the first metal layer 1304 is provided by using a deposition process (e.g., PVD, CVD, plating process).

Stage 2 illustrates a state of the integrated device after a photo resist layer 1306 (e.g., photo develop resist layer) is selectively provided (e.g., formed) on the first metal layer 1304. In some implementations, selectively providing the resist layer 1306 includes providing a first resist layer 1306 on the first metal layer 1304 and selectively removing portions of the resist layer 1306 by developing (e.g., using a development process). Stage 2 illustrates that the resist layer 1306 is provided such that a cavity 1308 is formed.

Stage 3 illustrates a state of the integrated device after a second metal layer 1310 is formed in the cavity 1308. In some implementations, the second metal layer 1310 is formed over an exposed portion of the first metal layer 1304. In some implementations, the second metal layer 1310 is provided by using a deposition process (e.g., plating process).

Stage 4 illustrates a state of the integrated device after the resist layer 1306 is removed. Different implementations may use different processes for removing the resist layer 1306.

Stage 5 illustrates a state of the integrated device after portions of the first metal layer 1304 are selectively removed. In some implementations, one or more portions of the first metal layer 1304 that is not covered by the second metal layer 1310 is removed. As shown in stage 5, the remaining first metal layer 1304 and the second metal layer 1310 may form and/or define an interconnect 1312 (e.g., trace, vias, pads) in an integrated device and/or a substrate. In some implementations, the first metal layer 1304 is removed such that a dimension (e.g., length, width) of the first metal layer 1304 underneath the second metal layer 1310 is about the same or smaller than a dimension (e.g., length, width) of the second metal layer 1310, which can result in an undercut, as shown at stage 5 of FIG. 13. In some implementations, the above mentioned processes may be iterated several times to provide and/or form several interconnects in one or more dielectric layers of an integrated device and/or substrate.

Figure 14:
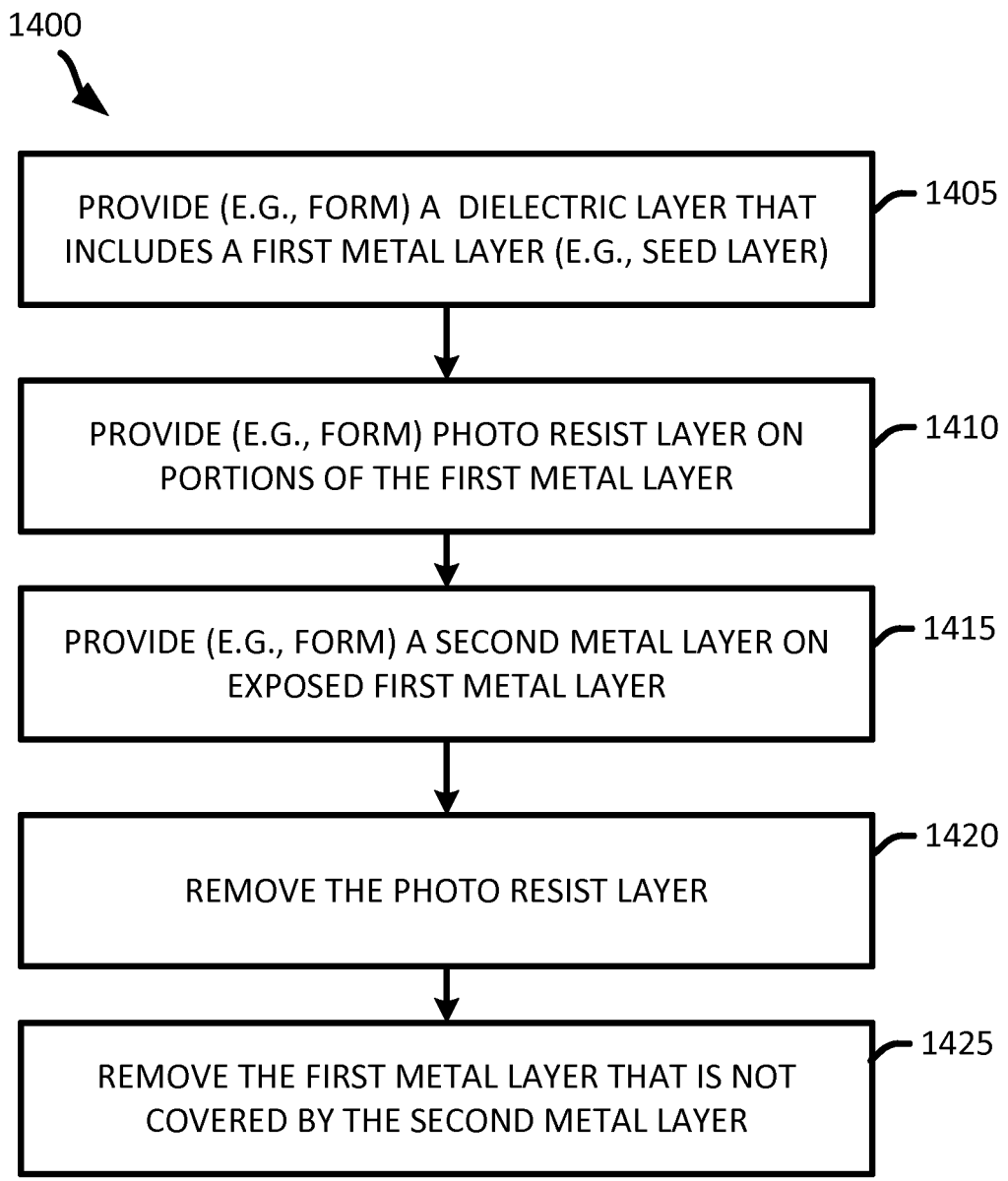
FIG. 14 illustrates an example of flow diagram of a semi-additive patterning (SAP) process.

FIG. 14 illustrates a flow diagram for a method for using a (SAP) process to provide and/or form an interconnect in one or more dielectric layer(s). The method provides (at 1405) a dielectric layer (e.g., dielectric layer 1302). In some implementations, providing the dielectric layer includes forming the dielectric layer. In some implementations, providing the dielectric layer includes forming a first metal layer (e.g., first metal layer 1304). The first metal layer is a seed layer in some implementations. In some implementations, the first metal layer may be provided (e.g., formed) on the dielectric layer after the dielectric layer is provided (e.g., received or formed). In some implementations, the first metal layer is provided by using a deposition process (e.g., physical vapor deposition (PVD) or plating process).

The method selectively provides (at 1410) a photo resist layer (e.g., a photo develop resist layer 1306) on the first metal layer. In some implementations, selectively providing the resist layer includes providing a first resist layer on the first metal layer and selectively removing portions of the resist layer (which provides one or more cavities).

The method then provides (at 1415) a second metal layer (e.g., second metal layer 1310) in the one or more cavities of the photo resist layer. In some implementations, the second metal layer is formed over an exposed portion of the first metal layer. In some implementations, the second metal layer is provided by using a deposition process (e.g., plating process).

The method further removes (at 1420) the resist layer. Different implementations may use different processes for removing the resist layer. The method also selectively removes (at 1425) portions of the first metal layer. In some implementations, one or more portions of the first metal layer that is not covered by the second metal layer are removed. In some implementations, any remaining first metal layer and second metal layer may form and/or define one or more interconnects (e.g., trace, vias, pads) in an integrated device and/or a substrate. In some implementations, the above mentioned method may be iterated several times to provide and/or form several interconnects in one or more dielectric layers of an integrated device and/or substrate.

Exemplary Damascene Process

Figure 15:
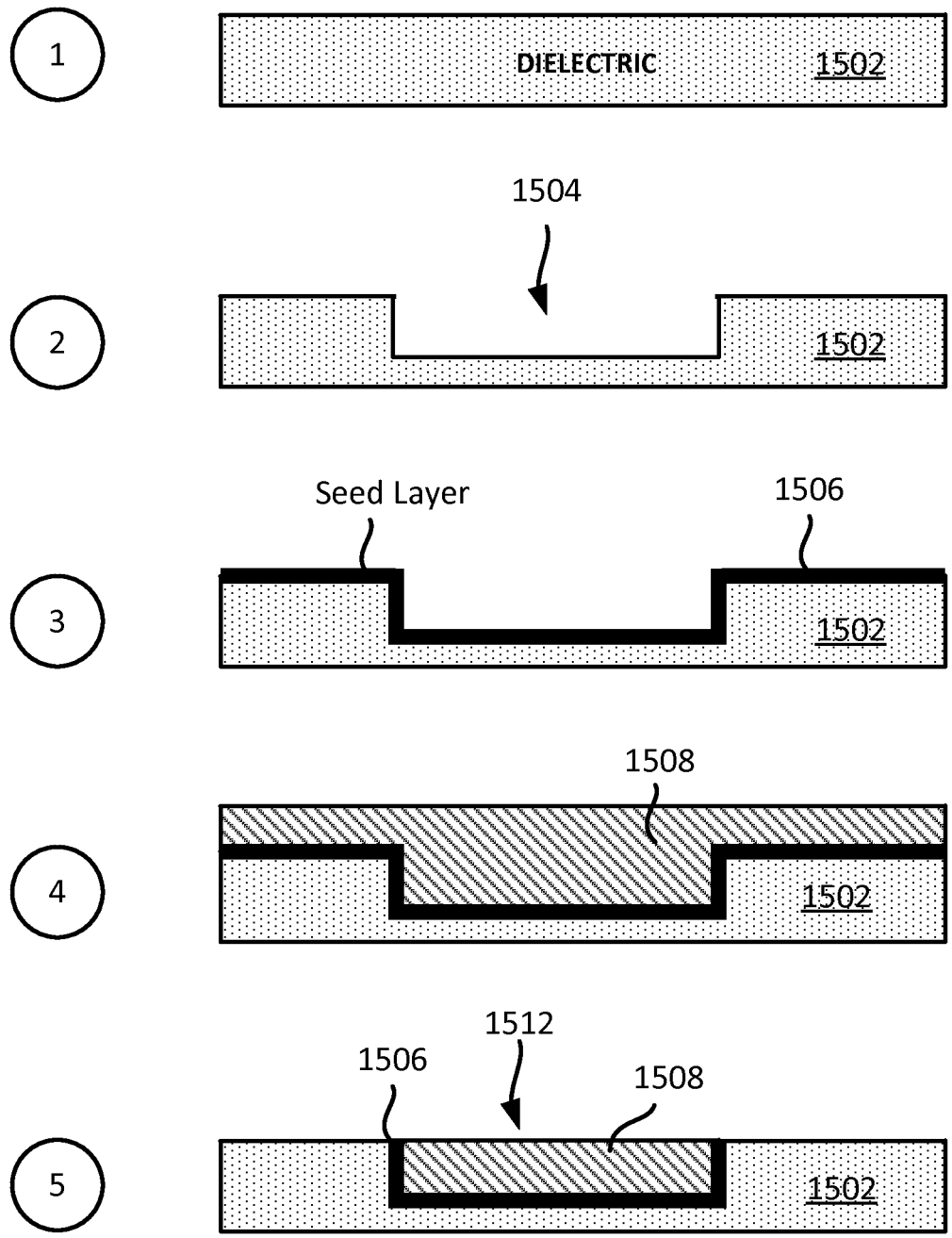
FIG. 15 illustrates an example of a damascene process.

FIG. 15 illustrates a sequence for forming an interconnect using a damascene process to provide and/or form an interconnect in a dielectric layer. As shown in FIG. 15, stage 1 illustrates a state of an integrated device after a dielectric layer 1502 is provided (e.g., formed). In some implementations, the dielectric layer 1502 is an inorganic layer (e.g., inorganic film).

Stage 2 illustrates a state of an integrated device after a cavity 1504 is formed in the dielectric layer 1502. Different implementations may use different processes for providing the cavity 1504 in the dielectric layer 1502.

Stage 3 illustrates a state of an integrated device after a first metal layer 1506 is provided on the dielectric layer 1502. As shown in stage 3, the first metal layer 1506 provided on a first surface of the dielectric layer 1502. The first metal layer 1506 is provided on the dielectric layer 1502 such that the first metal layer 1506 takes the contour of the dielectric layer 1502 including the contour of the cavity 1504. The first metal layer 1506 is a seed layer in some implementations. In some implementations, the first metal layer 1506 is provided by using a deposition process (e.g., physical vapor deposition (PVD), Chemical Vapor Deposition (CVD) or plating process).

Stage 4 illustrates a state of the integrated device after a second metal layer 1508 is formed in the cavity 1504 and a surface of the dielectric layer 1502. In some implementations, the second metal layer 1508 is formed over an exposed portion of the first metal layer 1506. In some implementations, the second metal layer 1508 is provided by using a deposition process (e.g., plating process).

Stage 5 illustrates a state of the integrated device after the portions of the second metal layer 1508 and portions of the first metal layer 1506 are removed. Different implementations may use different processes for removing the second metal layer 1508 and the first metal layer 1506. In some implementations, a chemical mechanical planarization (CMP) process is used to remove portions of the second metal layer 1508 and portions of the first metal layer 1506. As shown in stage 5, the remaining first metal layer 1506 and the second metal layer 1508 may form and/or define an interconnect 1512 (e.g., trace, vias, pads) in an integrated device and/or a substrate. As shown in stage 5, the interconnect 1512 is formed in such a way that the first metal layer 1506 is formed on the base portion and the side portion(s) of the second metal layer 1510. In some implementations, the cavity 1504 may include a combination of trenches and/or holes in two levels of dielectrics so that via and interconnects (e.g., metal traces) may be formed in a single deposition step, In some implementations, the above mentioned processes may be iterated several times to provide and/or form several interconnects in one or more dielectric layers of an integrated device and/or substrate.

Figure 16:
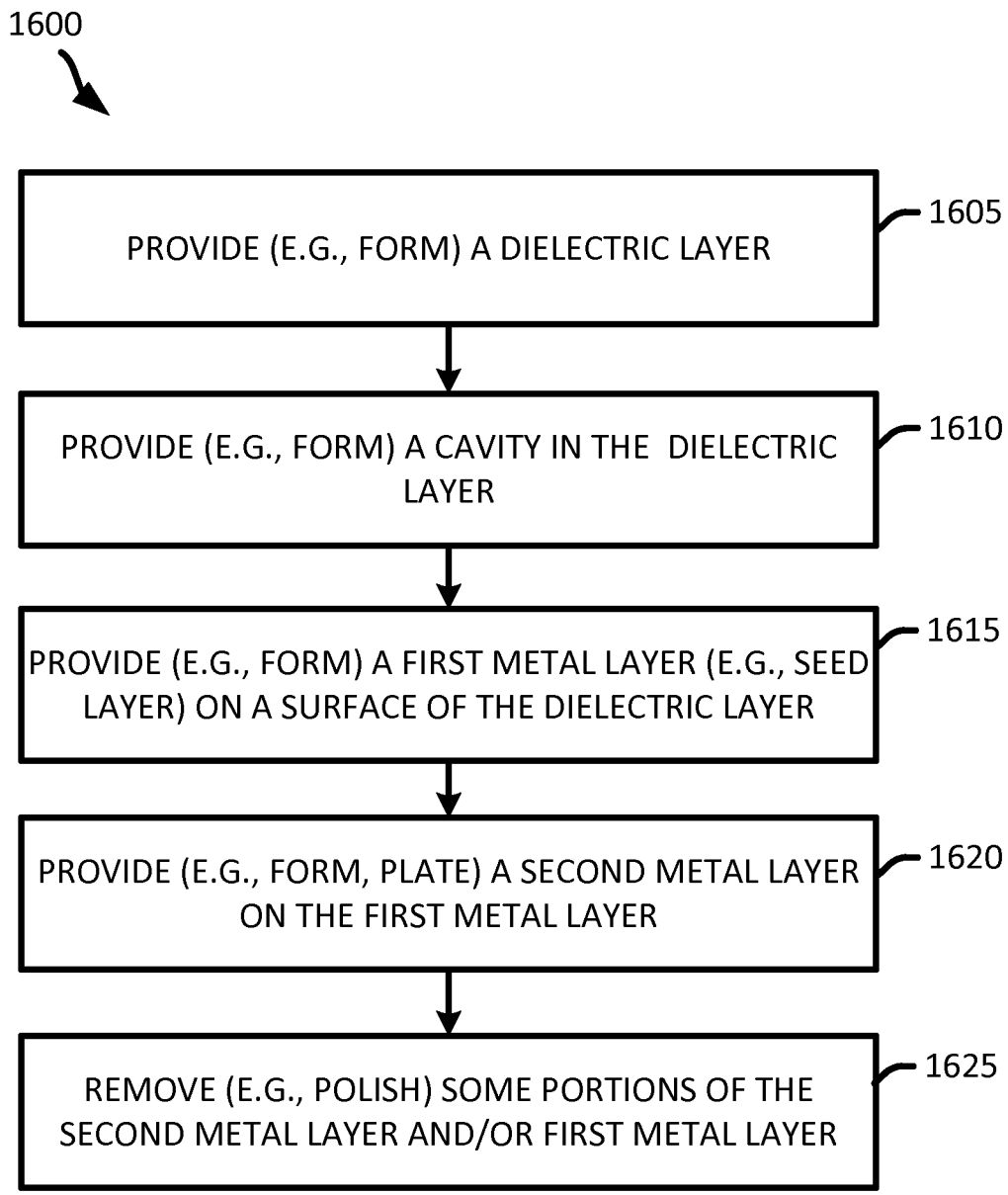
FIG. 16 illustrates an example of a flow diagram of a damascene process.

FIG. 16 illustrates a flow diagram of a method for forming an interconnect using a damascene process to provide and/or form an interconnect in a dielectric layer. The method provides (at 1605) a dielectric layer (e.g., dielectric layer 1502). In some implementations, providing a dielectric layer includes forming a dielectric layer. In some implementations, providing a dielectric layer includes receiving a dielectric layer from a supplier. In some implementations, the dielectric layer is an inorganic layer (e.g., inorganic film).

The method forms (at 1610) at least one cavity (e.g., cavity 1504) in the dielectric layer. Different implementations may use different processes for providing the cavity in the dielectric layer.

The method provides (at 1615) a first metal layer (e.g., first metal layer 1506) on the dielectric layer. In some implementations, the first metal layer is provided (e.g., formed) on a first surface of the dielectric later. In some implementations, the first metal layer is provided on the dielectric layer such that the first metal layer takes the contour of the dielectric layer including the contour of the cavity. The first metal layer is a seed layer in some implementations. In some implementations, the first metal layer 1506 is provided by using a deposition process (e.g., PVD, CVD or plating process).

The method provides (at 1620) a second metal layer (e.g., second metal layer 1508) in the cavity and a surface of the dielectric layer. In some implementations, the second metal layer is formed over an exposed portion of the first metal layer. In some implementations, the second metal layer is provided by using a deposition process (e.g., plating process). In some implementations, the second metal layer is similar or identical to the first metal layer. In some implementations, the second metal layer is different than the first metal layer.

The method then removes (at 1625) portions of the second metal layer and portions of the first metal layer. Different implementations may use different processes for removing the second metal layer and the first metal layer. In some implementations, a chemical mechanical planarization (CMP) process is used to remove portions of the second metal layer and portions of the first metal layer. In some implementations, the remaining first metal layer and the second metal layer may form and/or define an interconnect (e.g., interconnect 1512). In some implementations, an interconnect may include one of at least a trace, a via, and/or a pad) in an integrated device and/or a substrate. In some implementations, the interconnect is formed in such a way that the first metal layer is formed on the base portion and the side portion(s) of the second metal layer. In some implementations, the above mentioned method may be iterated several times to provide and/or form several interconnects in one or more dielectric layers of an integrated device and/or substrate.

Exemplary Electronic Devices

Figure 17:
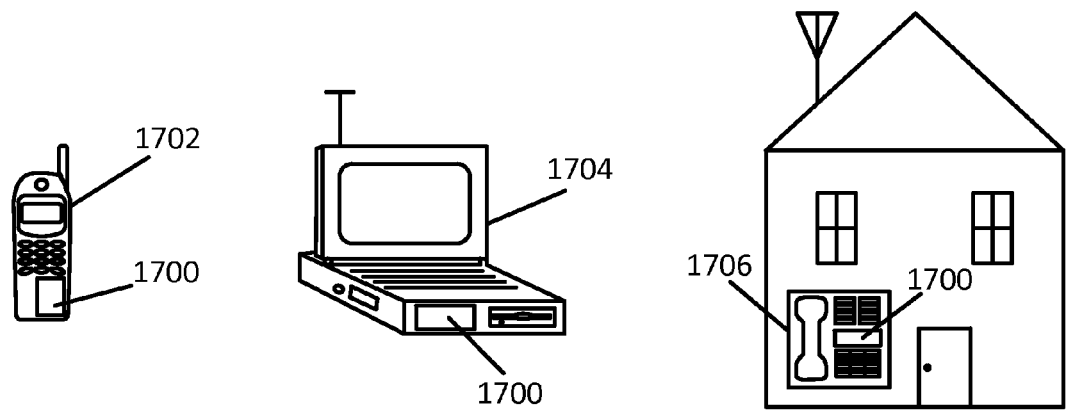
FIG. 17 illustrates various electronic devices that may integrate an integrated device package, a semiconductor device, a die, an integrated circuit and/or PCB described herein.

FIG. 17 illustrates various electronic devices that may be integrated with any of the aforementioned integrated device, semiconductor device, integrated circuit, die, interposer, package or package-on-package (PoP). For example, a mobile telephone 1702, a laptop computer 1704, and a fixed location terminal 1706 may include an integrated device 1700 as described herein. The integrated device 1700 may be, for example, any of the integrated circuits, dice, packages, package-on-packages described herein. The devices 1702, 1704, 1706 illustrated in FIG. 17 are merely exemplary. Other electronic devices may also feature the integrated device 1700 including, but not limited to, mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computer, wearable devices, or any other device that stores or retrieves data or computer instructions, or any combination thereof.

One or more of the components, steps, features, and/or functions illustrated in FIGS. 2, 3, 4, 5, 6, 7, 8, 9A-9D, 10, 11A-11D, 12, 13, 14, 15, 16 and/or 17 may be rearranged and/or combined into a single component, step, feature or function or embodied in several components, steps, or functions. Additional elements, components, steps, and/or functions may also be added without departing from the disclosure. It should also be noted that FIGS. 2, 3, 4, 5, 6, 7, 8, 9A-9D, 10, 11A-11D, 12, 13, 14, 15, 16 and/or 17 and its corresponding description in the present disclosure is not limited to dies and/or ICs. In some implementations, FIGS. 2, 3, 4, 5, 6, 7, 8, 9A-9D, 10, 11A-11D, 12, 13, 14, 15, 16 and/or 17 and its corresponding description may be used to manufacture, create, provide, and/or produce integrated devices. In some implementations, a device may include a die, a die package, an integrated circuit (IC), an integrated device, an integrated device package, a wafer, a semiconductor device, a package on package structure, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. An integrated device package comprising:
a die;
an electromagnetic (EM) passive device comprising:
 a base layer;
 a via traversing the base layer;
 a pad coupled to the via; and
 at least one interconnect configured to operate as an electromagnetic (EM) passive component, wherein the at least one interconnect is coupled to the pad;
an encapsulation layer at least partially encapsulating the die and the EM passive device; and
a redistribution portion coupling the die and the EM passive device, wherein the redistribution portion is configured to provide an electrical path between the die and the EM passive device.

2. The integrated device package of claim 1, wherein the EM passive device includes an electromagnetic (EM) passive component.

3. The integrated device package of claim 2, wherein the EM passive component comprises at least one of an inductor, a coupler and/or a transformer.

4. The integrated device package of claim 1, wherein the redistribution portion includes at least one redistribution layer that is configured to electrically couple the die to the EM passive device.

5. The integrated device package of claim 1, wherein the redistribution portion includes at least one redistribution layer that is configured as an electromagnetic (EM) shield.

6. The integrated device package of claim 5, wherein the EM shield is located in the redistribution portion such that the EM shield is at least partially vertically aligned with the EM passive device.

7. The integrated device package of claim 5, wherein the EM shield is configured to provide an electrical path for a ground signal.

8. The integrated device package of claim 5, wherein the EM shield is configured to be electrically coupled to the EM passive device.

9. The integrated device package of claim 1, wherein the integrated device package is incorporated into at least one of a music player, a video player, an entertainment unit, a navigation device, a communications device, a mobile device, a mobile phone, a smartphone, a personal digital assistant, a fixed location terminal, a tablet computer, a computer, a wearable device, and/or a laptop computer.

10. An apparatus comprising:
a die;
an electromagnetic (EM) means comprising;
 a base layer;
 a via traversing the base layer;
 a pad coupled to the via; and
 at least one interconnect configured to operate as an electromagnetic (EM) passive component, wherein the at least one interconnect is coupled to the pad;
an encapsulation layer at least partially encapsulating the die and the EM means; and
a redistribution portion coupling the die and the EM means, wherein the redistribution portion is configured to provide an electrical path between the die and the EM means.

11. The apparatus of claim 10, wherein the EM means includes an electromagnetic (EM) passive component.

12. The apparatus of claim 11, wherein the EM passive component comprises at least one of an inductor, a coupler and/or a transformer.

13. The apparatus of claim 10, wherein the redistribution portion includes at least one redistribution layer that is configured to electrically couple the die to the EM means.

14. The apparatus of claim 10, wherein the redistribution portion includes at least one redistribution layer that is configured as an electromagnetic (EM) shielding means.

15. The apparatus of claim 14, wherein the EM shielding means is located in the redistribution portion such that the EM shielding means is at least partially vertically aligned with the EM means.

16. The apparatus of claim 14, wherein the EM shielding means is configured to provide an electrical path for a ground signal.

17. The apparatus of claim 14, wherein the EM shielding means is configured to be electrically coupled to the EM means.

18. The apparatus of claim 10, wherein the apparatus is incorporated into at least one of a music player, a video player, an entertainment unit, a navigation device, a communications device, a mobile device, a mobile phone, a smartphone, a personal digital assistant, a fixed location terminal, a tablet computer, a computer, a wearable device, and/or a laptop computer.

19. The apparatus of claim 10, wherein an active side of the die is coupled to the redistribution portion.

20. The apparatus of claim 19, further comprising a set of solder balls coupled to the redistribution portion.

21. The apparatus of claim 10, wherein the EM means is substantially aligned with the die along a lateral direction of the apparatus, and wherein the lateral direction is substantially parallel to a surface, of the redistribution portion, that is coupled to the die.

22. The integrated device package of claim 1, wherein an active side of the die is coupled to the redistribution portion.

23. The integrated device package of claim 22, further comprising a set of solder balls coupled to the redistribution portion.

24. The integrated device package of claim 1, wherein the EM passive device is substantially aligned with the die along a lateral direction of the integrated device package, and wherein the lateral direction is substantially parallel to a surface, of the redistribution portion, that is coupled to the die.

\* \* \* \* \*